(12) United States Patent
McKinzie, III et al.

(10) Patent No.: US 7,215,007 B2
(45) Date of Patent: May 8, 2007

(54) CIRCUIT AND METHOD FOR SUPPRESSION OF ELECTROMAGNETIC COUPLING AND SWITCHING NOISE IN MULTILAYER PRINTED CIRCUIT BOARDS

(75) Inventors: William E. McKinzie, III, Fulton, MD (US); Shawn D. Rogers, Jessup, MD (US)

(73) Assignee: Wemtec, Inc., Fulton, MD (US)

( * ) Notice: Subject to any disclaimer, the term of this patent is extended or adjusted under 35 U.S.C. 154(b) by 0 days.

(21) Appl. No.: 10/794,185

(22) Filed: Mar. 3, 2004

(65) Prior Publication Data

US 2005/0029632 A1    Feb. 10, 2005

Related U.S. Application Data

(60) Provisional application No. 60/477,152, filed on Jun. 9, 2003.

(51) Int. Cl.
*H01L 29/40* (2006.01)
(52) U.S. Cl. ...................... 257/664; 257/665
(58) Field of Classification Search ............. 343/822, 343/829, 846, 909, 767, 700 MS; 333/12; 257/664, 259, 533, 665; 174/35 R; 307/101; 327/593
See application file for complete search history.

(56) References Cited

U.S. PATENT DOCUMENTS

| | | |
|---|---|---|
| 5,010,641 A | 4/1991 | Sisler |
| 5,079,069 A | 1/1992 | Howard et al. |
| 5,450,046 A | 9/1995 | Kosugi et al. |
| 5,451,917 A | 9/1995 | Yamamoto et al. |
| 5,870,274 A | 2/1999 | Lucas |
| 5,886,597 A | 3/1999 | Riad |
| 5,912,597 A | 6/1999 | Inagawa et al. |
| 5,973,929 A | 10/1999 | Arakawa et al. |
| 6,061,025 A | 5/2000 | Jackson et al. |
| 6,075,485 A | 6/2000 | Lilly et al. |
| 6,262,495 B1 | 7/2001 | Yablonowitch et al. |
| 6,366,443 B1 | 4/2002 | Devoe et al. |
| 6,411,261 B1 | 6/2002 | Lilly |
| 6,476,711 B2 | 11/2002 | McKinzie, III |
| 6,512,494 B1 | 1/2003 | Diaz et al. |
| 6,525,695 B2 | 2/2003 | McKinzie, III |

(Continued)

OTHER PUBLICATIONS

Ramesh Abhari and George V. Eleftheriades, "Suppression of the Parallel-Plate Noise in High Speed Circuits Using a Metallic Electromagnetic Band-Gap Structure," 2002 IEEE Microwave Theory and Techniques International Symposium, pp. 493-496.

(Continued)

*Primary Examiner*—Thien F Tran
(74) *Attorney, Agent, or Firm*—Brinks Hofer Gilson & Lione

(57) ABSTRACT

Apparatus for suppressing noise and electromagnetic coupling in the printed circuit board of an electronic device includes an upper conductive plate and an array of conductive coplanar patches positioned a distance $t_2$ from the upper conductive plate. The distance $t_2$ is chosen to optimize capacitance between the conductive coplanar patches and the upper conductive plate for suppression of noise or electromagnetic coupling. The apparatus further includes a lower conductive plate a distance $t_1$ from the array of conductive coplanar patches and conductive rods extending from respective patches to the lower conductive plate.

60 Claims, 20 Drawing Sheets

U.S. PATENT DOCUMENTS

| | | | |
|---|---|---|---|
| 6,538,538 | B2 | 3/2003 | Hreish et al. |
| 6,542,342 | B1 | 4/2003 | Hayashi et al. |
| 6,542,352 | B1 | 4/2003 | Devoe et al. |
| 6,567,048 | B2 | 5/2003 | McKinzie et al. |
| 6,587,327 | B1 | 7/2003 | Devoe et al. |
| 6,590,531 | B2 | 7/2003 | McKinzie, III et al. |
| 6,646,605 | B2 | 11/2003 | McKinzie, III et al. |
| 6,670,932 | B1 | 12/2003 | Diaz et al. |
| 6,690,327 | B2 | 1/2004 | McKinzie, III et al. |
| 6,751,082 | B2 | 6/2004 | Devoe et al. |
| 6,753,218 | B2 | 6/2004 | Devoe et al. |
| 6,768,476 | B2 | 7/2004 | Lilly et al. |
| 6,774,866 | B2 | 8/2004 | McKinzie, III et al. |
| 6,774,867 | B2 | 8/2004 | McKinzie, III et al. |
| 6,816,356 | B2 | 11/2004 | Devoe et al. |
| 6,831,602 | B2 | 12/2004 | McKinzie, III et al. |
| 6,867,746 | B2 | 3/2005 | Mendolia et al. |
| 6,888,316 | B2 | 5/2005 | Seo et al. |
| 6,897,831 | B2 | 5/2005 | McKinzie, III et al. |
| 6,906,674 | B2 | 6/2005 | McKinzie, III et al. |
| 6,917,343 | B2 | 7/2005 | Sanchez et al. |
| 6,933,895 | B2 | 8/2005 | Mendolia et al. |
| 6,937,192 | B2 | 8/2005 | Mendolia et al. |
| 6,970,341 | B1 | 11/2005 | Devoe et al. |
| 6,501,427 | B1 | 12/2005 | Lilly et al. |
| 2002/0183013 | A1 | 12/2002 | Auckland et al. |
| 2003/0011522 | A1* | 1/2003 | McKinzie et al. ... 343/700 MS |
| 2003/0025637 | A1 | 2/2003 | Mendolia et al. |
| 2003/0043071 | A1 | 3/2003 | Lilly et al. |
| 2003/0071763 | A1 | 4/2003 | McKinzie, III et al. |
| 2003/0137457 | A1 | 7/2003 | McKinzie, III et al. |
| 2005/0029632 | A1 | 2/2005 | McKinzie, III et al. |
| 2005/0205292 | A1 | 9/2005 | Rogers et al. |
| 2005/0224912 | A1 | 10/2005 | Rogers et al. |

OTHER PUBLICATIONS

Telesphor Kamgaing and Omar M. Ramahi, "High-Impedance Electromagnetic Surfaces for Parallel-Plate Mode Suppression in High Speed Digital Systems," IEEE 11th Topical Meeting on Electrical Performance of Electronic Packaging, Oct. 21-23, 2002, Monterey, CA, pp. 279-282.

Telesphor Kamgaing and Omar M. Ramahi, "A Novel Power Plane with Integrated Simultaneous Switching Noise Mitigation Capability Using High Impedance Surface," IEEE Microwave and Wireless Components Letters, vol. 13, No. 1, Jan. 2003, pp. 21-23.

S. Clavijo, R. Diaz, and W. McKinzie, "Design Methodology for Sievenpiper High-Impedance Surfaces: An Artificial Magnetic Conductor for Positive Gain Electrically Small Antennas." Submitted in Oct. 2002 to the IEEE Transactions on Antennas and Propagation for publication in their Special Issue on Metamaterials. Publication date TBD.

S. Van den Berghe, F. Olyslager, D. De Zutter, J. De Moerloose, and W. Temmerman, "Study of the Ground Bounce Caused by Power Plane Resonances," IEEE Trans. Electromag. Compat., vol. 40, No. 2, pp. 111-119, May 1998.

N. Na, J. Choi, S. Chun, M. Swaminathan, and J. Srinivasan, "Modeling and Transient Simulation of Planes in Electronic Packages," IEEE Trans. Advanced Packaging, vol. 23, No. 3, pp. 340-352, Aug. 2000.

S. Chun, M. Swaminathan, L. D. Smith, J. Srinivasan Z. Jin and M. K. Iyer, "Modeling of Simultaneous Switching Noise in High Speed Systems," IEEE Trans. Advanced Packaging, vol. 24, No. 2, pp. 132-142, May 2001.

T. Tarvainen, "Simplified Modeling of Parallel Plate Resonances on Multilayer Printed Circuit Boards," IEEE Trans. Electromag. Compat., vol. 42, No. 3, pp. 284-289, Aug. 2000.

A. R. Djordjevic and T.K. Sarkar, "An Investigation of Delta-I noise on Integrated Circuits," IEEE Trans. Electromag. Compat., vol. 35, No. 2, pp. 134-147, May 1993. [6] L. D. Smith, "Simultaneous Switch Noise and Power Plane Bounce for CMOS technology," Proc. IEEE 8th Topical Meeting Elect. Perform. Electron. Packag., San Diego, CA, pp. 163-166, Oct. 1999.

L. D. Smith, "Simultaneous Switch Noise and Power Plane Bounce for CMOS technology," Proc.IEEE 8th Topical Meeting Elect. Perform. Electron. Packag., San Diego, CA, pp. 163-166, Oct. 1999.

K. Lee and A. Barber, "Modeling and Analysis of Multichip Module Power Supply planes," IEEE Trans. Comp., Packaging, Manuf., Tech.-PART B, vol. 18, No. 4, pp. 628-638, Nov. 1995.

Edward R. Pillai, "Coax Via—A Technique to Reduce Crosstalk and Enhance Impedance Match at Vias in High-Frequency Multilayer Packages Verified by FDTD and MoM Modeling," IEEE Trans. Microwave Theory Tech., vol. 45, No. 10, pp. 1981-1985, Oct. 1997.

H. H. Wu, J. W. Meyer, K. Lee and A. Barber "Accurate Power Supply and Ground Plane Pair Models," IEEE Trans. Advanced Packaging, vol. 22, No. 3, pp. 259-266, Aug. 1999.

W. Pinello, A. C. Cangellaris and A. Ruehli, "Hybrid Electromagnetic Modeling of Noise Interactions in Packaged Electronics Based on the Partial-Element Equivalent Circuit Formulation," IEEE Trans. Microwave Theory Tech., vol. 45, No. 10, pp. 1889-1896, Oct. 1997.

B. Archambeault and A. E. Ruehli, "Analysis of Power/Ground-plane EMI Decoupling Performance Using the Partial-Element Equivalent Circuit Technique," IEEE Trans. Electromag. Compat., vol. 43, No. 4, pp. 437-445, Nov. 2001. p. 18 of 15119.

M. Piket-May, A. Taflove and J. Baron, "FD-TD Modeling of Digital Signal Propagation in 3-D Circuits with Passive and Active Loads," IEEE Trans. Microwave Theory Tech., vol. 42, No. 8, pp. 1514-1523, Aug. 1994.

R. Mittra, W. D. Becker and P. H. Harms, "A General Purpose Maxwell Solver for the Extraction of Equivalent Circuits of Electronic Package Components for Circuit Simulation," IEEE Trans. Circuits and Systems-Part 1: Fundamental Theory and Applications, vol. 39, No. 11, pp. 964-973, Nov. 1992.

T. H. Hubing, J. L. Drewniak, T. P. Van Doren and D. M. Hockason, "Power Bus Decoupling on Multilayer Printed Circuit Boards," IEEE Trans. Electromag. Compat., vol. 37, No. 2, pp. 155-166, May 1995.

International Search Report dated Apr. 19, 2005, for International Application No. PCT/US2005/13235.

International Search Report dated Oct. 21, 2005, for International Application No. PCT/US2005/06784.

Daniel R. Sievenpiper, "High-Impedance Electromagnetic Surfaces," Dissertation, UCLA Electrical Engineering Dept., filed Jan. 1999.

Abhari et al., Metallo-Dielectric Electromagnetic Bandgap Structures for Suppression and Isolation of the Parallel-Plate Noise in High Speed Circuits, IEEE Trans., MTT, vol. 51, No. 6, Jun. 2003.

Kamgaing et al., "Electromagnetic Band-Gap Structures for Multiband Mitigation of Resonant Modes in Parallel-Plane Waveguides", IEEE 2004.

Kamgaing et al., "Inductance-Enhanced High-Impedance Surfaces for Broadband Simultaneous Switching Noise Mitigation in Power Planes", 2003 IEEE MTT-S Intl. Microwave Symp. Digest, pp. 2165-2168, Philadelphia, PA, Jun. 8-13, 2003.

Kamgaing et al., "Development and Application for Physics-based Compact Models for High-Impedance Electromagnetic Surfaces Integrated in a Power Plane Configuration", IEEE Intl. Antennas and Propagation Symp., vol. 4, pp. 442-445, Columbus, OH, Jun. 22-27, 2003.

Lee, Thomas H., "A Vertical Leap for Microchips" Scientific America, pp. 9-18, Jan. 2002.

* cited by examiner

Notes:
1. The superstrate used is 15 mil FR4 bonded to the AMC using 3 mils of PSA.

2. The AMC used is 5000-93-315-SL-001
   Period = 315 mils or 8 mm
   Gap between patches is 30 mils or 0.75 mm
   Patch size = 7.25 mm square
   Via dia. = 20 mils or 0.5 mm
   AMC Thickness = 93 mils or 2.36 mm
   AMC Core is FR4

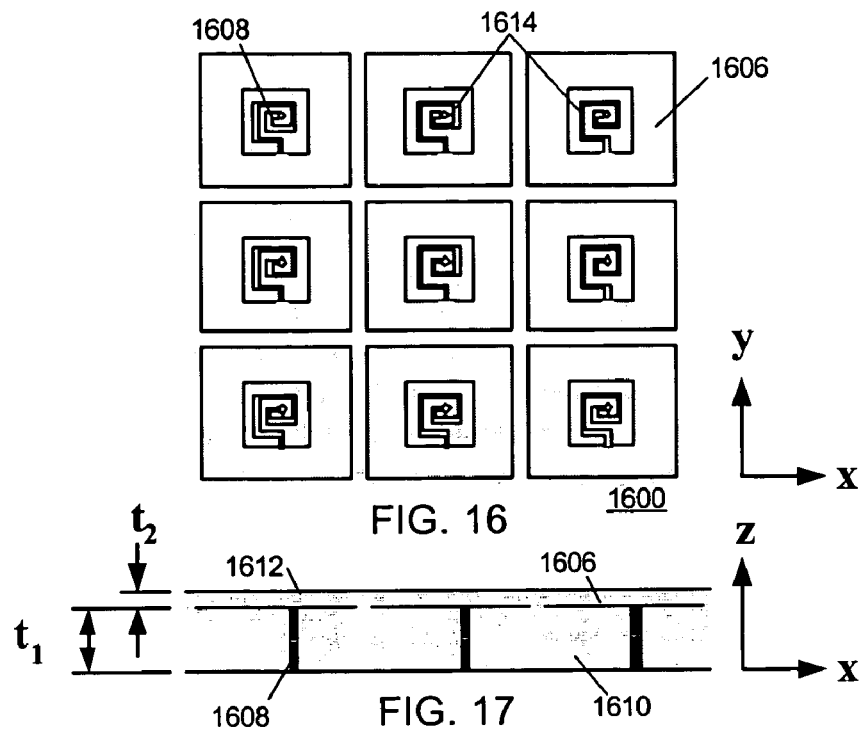
FIG. 16
FIG. 17
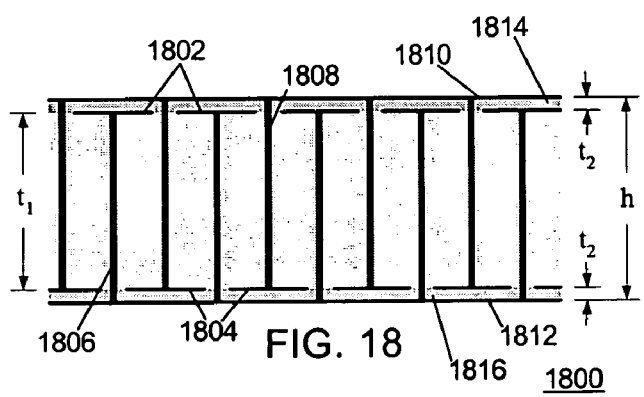
FIG. 18
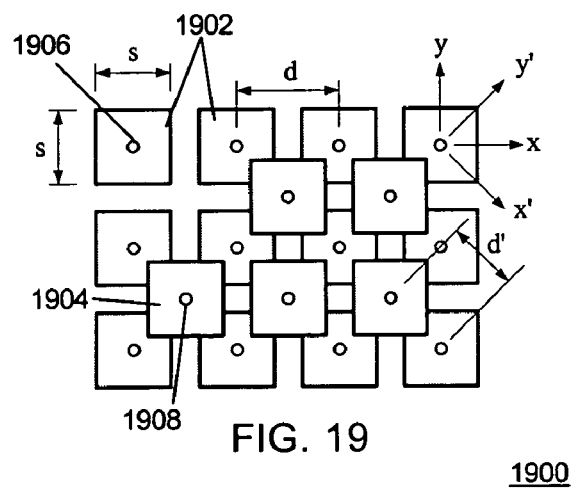
FIG. 19

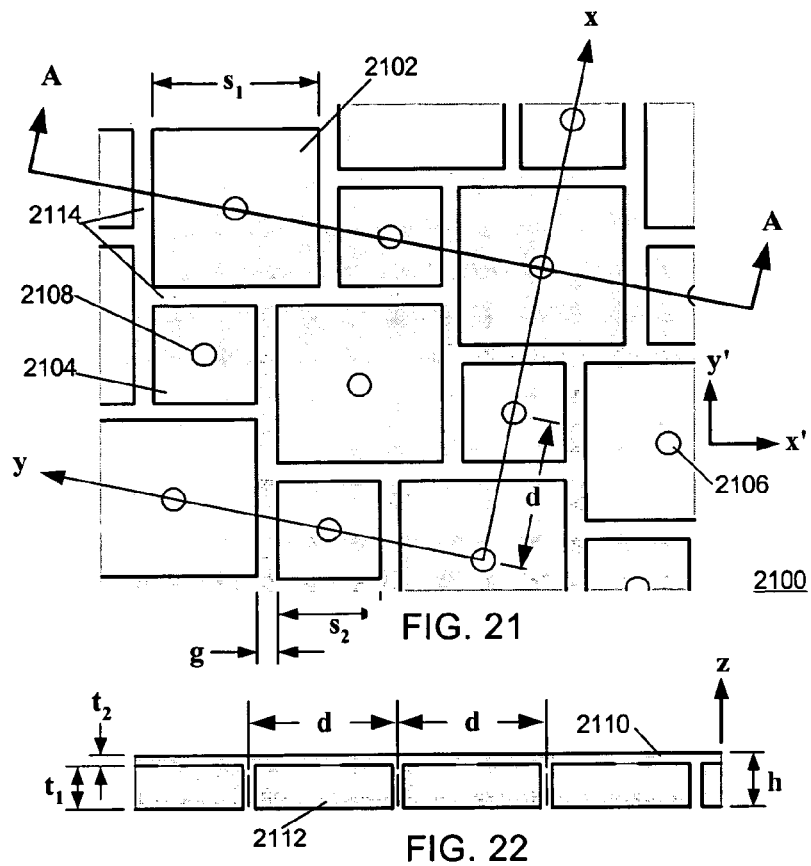
FIG. 21
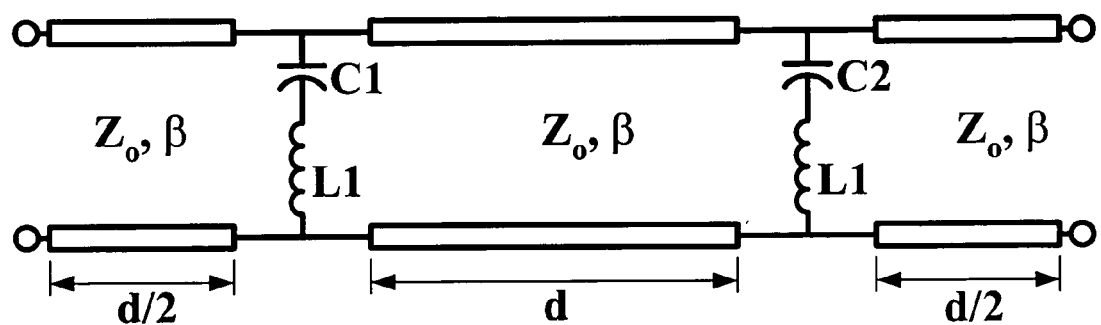
FIG. 22
FIG. 23

CIRCUIT AND METHOD FOR SUPPRESSION OF ELECTROMAGNETIC COUPLING AND SWITCHING NOISE IN MULTILAYER PRINTED CIRCUIT BOARDS

REFERENCE TO RELATED APPLICATIONS

The present patent application claims the benefit of the filing date under 35 U.S.C. § 119(e) of Provisional U.S. Patent Application Ser. No. 60/477,152 filed Jun. 9, 2003, entitled "Circuit and Method For Suppression of Transverse Electromagnetic Modes" and is related to U.S. patent application Ser. No. 10/167,954 filed Jun. 12, 2002, entitled "Aperture Antenna Having a High-Impedance Backing" which claims the benefit of the filing date under 35 U.S.C. § 119(e) of Provisional U.S. Patent Application Ser. No. 60/298,654, filed on Jun. 15, 2001. All of the foregoing applications are hereby incorporated herein in their entirety by this reference.

BACKGROUND

This invention is related generally to reduction of noise induced in power planes due to switching of digital circuits. More particularly, the present invention is related to circuits and method for suppression of transverse electromagnetic modes in parallel plate waveguides.

A common problem in electronic systems is switching noise induced in the power distribution system by switching of digital circuits of the system. Conventionally, such a system has one or more power planes designated, for example, +Vcc, and one or more ground planes. The potential difference between the power plane and the ground plane provides the DC operating voltage for the circuits of the system. If the system includes digital or other circuits with fast-switching outputs, noise can be induced in the power planes and even in the ground plane. The noise may have several sources, but generally is due to the high slew rate of the digital output and the non-zero inductance of the power plane. Especially for an output driving a large capacitive load, the L(di/dt) noise can be substantial. This noise on the power plane can affect other circuits, slowing system operation or producing data errors. The problem occurs in all types of systems, including integrated circuits and circuits formed on printed circuit boards (PCBs).

Existing EMI solutions to mitigate power plane noise induced by digital switching include the use of radio frequency (RF) bypass capacitors between +Vcc and ground layers, the use of very thin high dielectric constant, or low impedance, parallel-plate waveguides for power distribution, the use of split power planes which meet at only one common point, and other methods.

Board mounted bypass capacitors are the standard RF noise decoupling approach. The idea of this approach is to provide a very low reactance path between power and ground to decouple RF signals from the power terminal of a switching device such as a digital IC. To this end, banks of capacitors of widely different values (lower values have less parasitic inductance) are placed as close as possible to the power pins of integrated circuits.

Depending on the application, this approach is often adequate to reduce the power plane noise problem to an acceptable level. Capacitors are relatively inexpensive to add to a PCB design. However, such capacitors have practical high frequency limits of about 1 GHz or less due to the parasitic series inductance of vias used to connect the bypass capacitor between +Vcc and ground layers. Also, the parasitic inductance inherent in the capacitors reduces the high frequency limit of operation. Also, these capacitors consume valuable PCB real estate and add to the bill of materials cost.

The use of very thin (~2 mil) dielectric cores, such as Nelco 4000-13 BC or ZBC 2000™ from Merix Corp., Forest Grove, Oreg., to separate power and ground planes will help to decouple RF signals so that the required number of decoupling capacitors may be reduced. This approach is called a buried capacitor layer. However, it will not suppress the parasitic resonance of parallel plate modes because it will not cut off TEM modes.

Subdividing the power and/or ground planes into multiple smaller planes connected only at one point will help to isolate digital noise and raise the frequency of parasitic resonances, but it will not eliminate the power plane noise problem. There are also practical limits as to how small or narrow power or ground planes can be made. As the conductors become narrower, the self inductance of the traces can create noticeable voltage drops due to L(di/dt) when fast switching occurs for high current loads. Also, narrow necks in the power or ground planes can cause heating due to resistive losses or complete breakdown at sufficiently high current levels.

The described problems are not limited to board-level designs. Semiconductor integrated circuits also suffer from switching noise induced in power and ground lines. Many of the problems described herein for PCB devices are exacerbated by the high degree of integration of a large integrated circuit.

One reference (Kamgaing, 2002) has tested a parallel plate waveguide which has a lower plate formed by an electromagnetic bandgap structure. While the disclosed device has some desirable features, the overall thickness of the disclosed parallel plate waveguide is more than 4.5 mm. For modern printed circuit board applications, this dimension is far too large for practical application. A much thinner parallel plate waveguide is required for integration as a power distribution system in a PCB.

Accordingly, there is a need for improved circuits, devices and methods for reducing induced power plane noise and improving RF isolation.

BRIEF SUMMARY

By way of introduction only, the present embodiments provide a two-dimensional, periodic, metallic structure, which acts as a distributed microwave bandstop filter integrated into a parallel-plate waveguide. These embodiments can be used as an electromagnetic interference (EMI) filter to suppress digital noise on power planes, as well as to eliminate power plane resonances. Hence, they may be used for EMI and EMC (electromagnetic compatibility) purposes in printed circuit boards.

In particular embodiments, the new structure may be formed as part of a printed circuit board (PCB) power distribution network to reduce noise coupled from digital switching circuits to power and ground planes of the PCB. A lower conductive plate is used as one plane and an upper conductive plate is used as the other plane. An array of conductive patches and an array of conductive vias or rods are positioned between the plates and intervening dielectric layers. By tailoring the permittivity and thickness of the dielectric layers within the structure, as well as the patch size and via diameter, and the size, number, and/or distribution of the conductive vias these structures may be optimized to produce a stopband in which TEM mode propagation is suppressed over desired frequency ranges. Furthermore, these TEM mode suppression circuits can be made thinner than known suppression circuits by more than one order of magnitude for the same or better electrical performance.

Some embodiments of the present invention are arranged as periodic structures. As such, the structure must have electromagnetic stopbands and passbands for TEM modes that propagate in parallel-plate waveguides. Therefore, the structure shares characteristics of electromagnetic bandgap (EBG) filter concepts.

The new structure, when used as part of a printed circuit board design, permits elimination of many of the higher frequency surface-mounted bypass capacitors used in conventional PCB designs, along with the concomitant increased material and manufacturing costs. Also, the new structure offers significantly improved RF isolation over frequency bands unattainable in conventional designs using bypass capacitors alone.

The foregoing summary has been provided only by way of introduction. Nothing in this section should be taken as a limitation on the following claims, which define the scope of the invention.

BRIEF DESCRIPTION OF THE DRAWINGS

FIG. 16 and FIG. 17 illustrate a fourth embodiment of a TEM mode suppression circuit;

FIG. 18 is a profile view for an embodiment of a TEM mode suppression circuit containing two levels of capacitive patches;

FIG. 19 is a plan view of the patches only for the embodiment of a TEM mode suppression circuit containing two levels of capacitive patches;

FIGS. 21 and 22 shows a TEM mode suppression circuit in a parallel plate waveguide with non-uniform patches to create a modulated shunt load with period 2d;

FIG. 23 is an equivalent circuit shown for the parallel plate waveguide of FIGS. 21 and 22;

DETAILED DESCRIPTION OF THE PRESENTLY PREFERRED EMBODIMENTS

Figure 1:
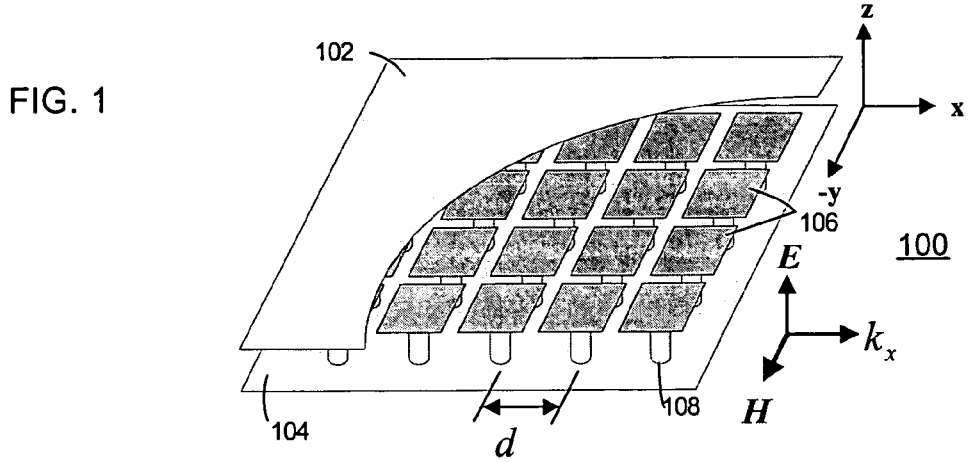
FIG. 1 and FIG. 2 illustrate a first embodiment of a parallel plate waveguide with noise suppression circuit.
Figure 2:
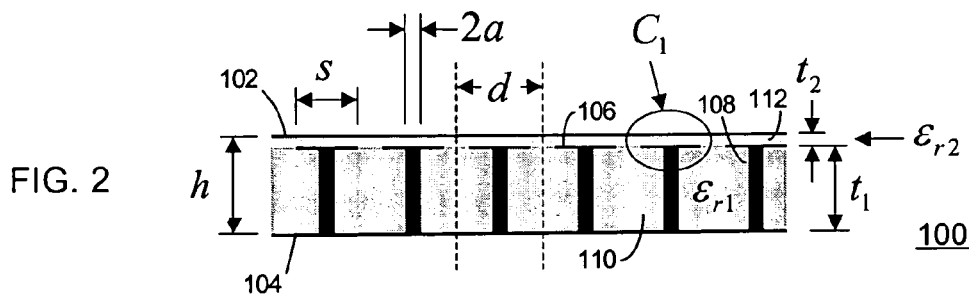

Referring now to the drawing, FIG. 1 and FIG. 2 illustrate a first embodiment of a parallel plate wave guide (PPW) 100 containing a transverse electromagnetic (TEM) mode suppression circuit. FIG. 1 is a perspective view of the PPW 100 and FIG. 2 is a cross-sectional view of the PPW 100. Coordinate axes establish the x, y and z directions as used herein.

As shown in FIGS. 1 and 2, the PPW 100 includes an upper conductive plate 102, a lower conductive plate 104, an array of conductive coplanar patches 106 located a distance $t_2$ from the upper plate 102, an array of conductive rods or vias 108 of length $t_1$ and radius a that connect the lower plate 104 to the center of each patch 106, a first dielectric layer 110 and a second dielectric layer 112. The patches 106 are illustrated to be squares of side length s in FIG. 1, but other shapes such as rectangular, hexagonal, triangular, circular, etc. can be used. The patch realizes a parallel-plate capacitance between the end of the rod 108 below it and the upper plate 102 of the PPW 100. The rods 108 are oriented generally normal to the lower conductive plate 104. Each respective rod 108 is in electrical contact with the lower conductive plate 104 and with a respective patch 106. In the embodiment of FIG. 2, each patch 106 has an associated rod 108. In some embodiments, some of the rods may be omitted so that there is not a one-to-one correspondence between rods and patches.

The patches 106 and rods 108 in the embodiment of FIGS. 1 and 2 are arrayed in a square lattice of period d. The total height of the PPW 100 is denoted as h. Also, the two dielectric layers 110, 112 form the host dielectric medium of the PPW 100. The first or lower layer 112 of thickness $t_1$, containing the rods 108, has a relative dielectric constant of $\in_{r1}$, while the upper layer 112 of thickness $t_2$ has a relative dielectric constant of $\in_{r2}$. As will be described in greater detail below, a preferred embodiment has $t_2 < t_1$ and $\in_{r2} \geq \in_{r1}$.

The dielectric layers 110, 112 are assumed to be isotropic in this analysis. However, only the normal or z-directed tensor component of permittivity affects the electric field of the TEM mode. So if anisotropic dielectric materials are used for the insulating layers 110, 112, then the z tensor element can be substituted for the relative dielectric constant.

The geometries and material properties illustrated in FIGS. 1 and 2 are intended to be illustrative only. Other variations may be readily substituted and combined to achieve particular design goals or accommodate particular materials or manufacturing processes. Unless otherwise noted, the dimensions shown in the following figures do not include metal thickness, which is assumed in the following analysis to be relatively thin.

One purpose of the embodiments described herein is to attenuate parallel-plate transverse electromagnetic (TEM) modes that are naturally guided between parallel metal planes 102, 104 as shown in FIG. 1. TEM modes are guided waves moving transverse or across the inside surface of the PPW, in parallel with the plane of the PPW. As shown in FIG. 1, the metal or other conductor planes lie parallel to the x-y plane. A TEM mode has a normal (z-directed) electric field and a transverse (y-directed) magnetic field, assuming wave propagation in the x direction. An empty parallel-plate waveguide (PPW) allows the TEM mode to propagate from DC to an infinite frequency. In this context, an empty PPW is one with no electromagnetic bandgap (EBG) structure. There exists no inherent cutoff frequency for TEM modes in an empty PPW.

The present embodiments are designed to create one or more stopbands of frequencies over which TEM modes are not allowed to propagate within a PPW. Hence these embodiments may be referred to as TEM mode suppression circuits. The lowest frequency stopband will be denoted as the fundamental stopband.

Figure 3:
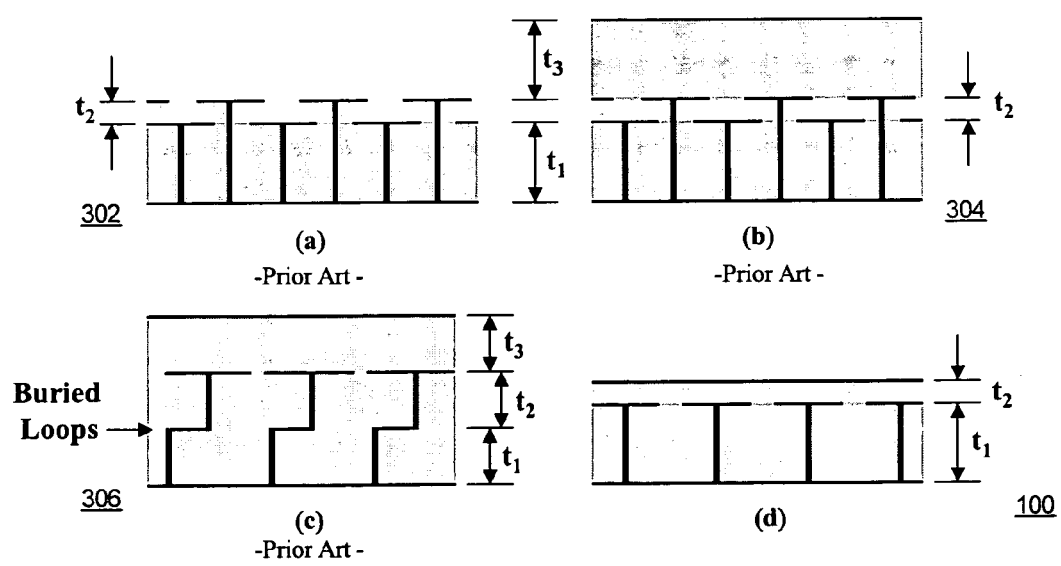
FIG. 3 illustrates several prior art mode suppression circuits for comparison with the first embodiment illustrated in greater detail in FIGS. 1 and 2.

To illustrate some differences between the embodiment of FIGS. 1 and 2, and conventional high impedance surfaces, consider FIG. 3. This figure illustrates several prior art high impedance circuits, labeled example (a), example (b) and example (c) in comparison with the first embodiment illustrated in greater detail in FIGS. 1 and 2, which is labeled example (d). The illustrated examples are cross sectional views of several waveguiding structures. Consistent with the illustration of FIGS. 1 and 2, shaded regions represent dielectric layers of thicknesses $t_1$, $t_2$, $t_3$ that typically have different dielectric constants. The horizontal lines inside the waveguiding structures of FIG. 3 represent patches connected to the metal vias or conducting rods. In example (c), buried loops are otherwise noted.

Example (a) shows a prior art (Sievenpiper, 1999), open waveguide, a high-impedance surface 302. The high impedance surface 302 does not include an upper conductive plate, such as the upper conductive layer 102 of FIGS. 1 and 2. As an open structure, the high impedance surface 302 will not support TEM modes as a PPW, but it does offer a high-impedance surface. Such a surface will inhibit the flow of equivalent surface currents over a limited band of frequencies. Two metal layers are shown for the high impedance surface 302. These layers form a capacitive frequency selective surface (FSS) to permit the structure to exhibit a high surface impedance when connected to the ground plane through vias.

Example (b) of FIG. 3 shows a high impedance surface 304 in which the high-impedance surface 302 of example (a) is covered to make a PPW. In this structure 304, PPW modes are suppressed over a band of frequencies similar to the reflection phase bandwidth of the uncovered high-impedance surface 302. This property has also been used for suppression of noise on digital power planes. In a prior art application (Abhari, 2002), a TEM mode stopband was demonstrated from 3.2 GHz to 4.9 GHz, a ratio of about 1.5:1 for a PPW structure whose total height was about 3.3 mm. However, manufacture of the high impedance surface 304 requires two extra layers of metal in addition to the upper and lower plates of the PPW. The 3.3 mm height is approximately 10 to 20 times too thick for practical applications in commercial PCBs.

Example (c) of FIG. 3 shows a prior art (Kamgaing, 2002, 2003) variation of a covered high-impedance ground plane 306 in which buried loops, namely half-loop inductors, are designed in series with the vias. Again, as in the structure 304 of example (b), two extra layers of metal are required in addition to the upper and lower plates of the PPW. The structure of the high impedance ground plane 306 has only one layer of patches. An additional metal layer is required for buried loops. Published data implies a stopband of about 61% to 70%, up to a 2:1 ratio, depending on via length. Total thickness of the experimental structure is about 3(1.54 mm), or 4.62 mm for the 61% bandwidth and 7.5 mm for the 70% bandwidth.

Example (d) of FIG. 3 shows the PPW 100 embodiment of FIGS. 1 and 2. Here, the upper layer of patches of the high-impedance surface of example (a) has been replaced with a solid metal plane, the upper plate of the PPW 100. The total height of this structure can be less than 1 mm and the PPW 100 can still achieve a bandwidth in excess of 6:1 for the fundamental stopband using only conventional printed circuit board (PCB) materials and processes. Furthermore, the thickness $t_2$ is typically less than 0.1 mm. This will be described in greater detail below.

Figure 4:
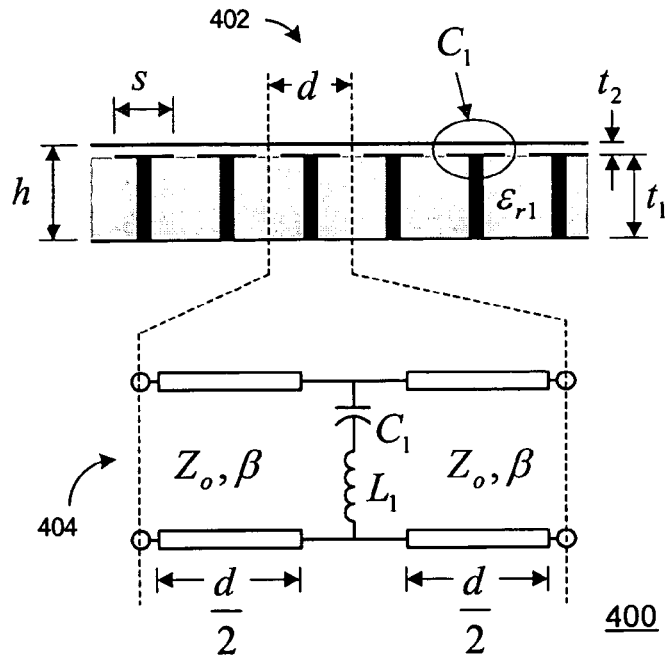
FIG. 4 illustrates a transmission line model for the embodiment of FIGS. 1 and 2.

FIG. 4 illustrates a transmission line model 400 for the embodiment of FIGS. 1 and 2. The stopband properties of the present embodiments may be understood through a circuit analysis of only one unit cell 402. A quasi-TEM mode on the empty PPW (without patches or vias) can be modeled as a simple transmission line 404 whose characteristic impedance and phase constant are given by $$Z_o = \frac{\eta_o}{\sqrt{\varepsilon_{r,eff}}} \frac{h}{d} \text{ and} \qquad (1)$$

$$\beta = \frac{\omega}{c}\sqrt{\varepsilon_{r,eff}} \qquad (2)$$

where $\eta_o$ is the wave impedance of free space, 377 Ω, c is the speed of light in a vacuum, ω is the radian frequency, and the effective dielectric constant for the z-directed electric field is given by $$\varepsilon_{r,eff} = \frac{t_1 + t_2}{\frac{t_1}{\varepsilon_{r1}} + \frac{t_2}{\varepsilon_{r2}}}. \quad (3)$$

In the model 400, the presence of patches and vias is accounted for by a shunt LC branch circuit. The lumped capacitance $C_1$ is approximated by $$C_1 = \frac{\varepsilon_o \varepsilon_{r2} s^2}{t_2} \quad (4)$$

where $\varepsilon_o$ is the permittivity of free space ($\sim 8.85 \times 10^{-12}$ F/m). The lumped inductor $L_1$ can be estimated by $$L_1 = \frac{\mu_o(h - t_2)}{4\pi}\left[\ln\left(\frac{1}{\alpha}\right) + \alpha - 1\right] \quad (5)$$

where $\mu_o$ is the permeability of free space ($4\pi \times 10^{-7}$ H/m), and the parameter $\alpha$ is the ratio of the via cross section to the cross section of the entire unit cell:

$$\alpha = \frac{\pi a^2}{d^2} \quad (6)$$

Here the parameter a denotes the radius of a cylindrical via. Note that vias or rods of any cross section can be used, such as square pins, with a corresponding edit to equation (6) to modify the via cross section term.

The patch and via present a shunt susceptance given by $$Y = \frac{j\omega C_1}{1 - \omega^2 L_1 C_1} \quad (7)$$

To predict the dispersive behavior of this shunt loaded PPW, we can analyze the unit cell 402 using ABCD parameters where the unit cell has an effective phase constant of $k_x$:

$$\begin{bmatrix} \cos(k_x d) & jZ_{o,eff}\sin(k_x d) \\ jY_{o,eff}\sin(k_x d) & \cos(k_x d) \end{bmatrix} = \quad (8)$$

$$\begin{bmatrix} \cos\left(\beta\frac{d}{2}\right) & jZ_o\sin\left(\beta\frac{d}{2}\right) \\ jY_o\sin\left(\beta\frac{d}{2}\right) & \cos\left(\beta\frac{d}{2}\right) \end{bmatrix} \begin{bmatrix} 1 & 0 \\ Y & 1 \end{bmatrix}$$

$$\begin{bmatrix} \cos\left(\beta\frac{d}{2}\right) & jZ_o\sin\left(\beta\frac{d}{2}\right) \\ jY_o\sin\left(\beta\frac{d}{2}\right) & \cos\left(\beta\frac{d}{2}\right) \end{bmatrix}.$$

Evaluation of the A component yields the dispersion equation $$\cos(k_x d) = \cos(\beta d) + j\frac{Z_o Y}{2}\sin(\beta d), \quad (9)$$

from which we can explicitly solve for the effective phase constant $k_x$:

$$k_x = \frac{1}{d}\cos^{-1}\left[\cos(\beta d) - \frac{\omega C_1 Z_o}{2(1 - \omega^2 L_1 C_1)}\sin(\beta d)\right]. \quad (10)$$

Figure 5:
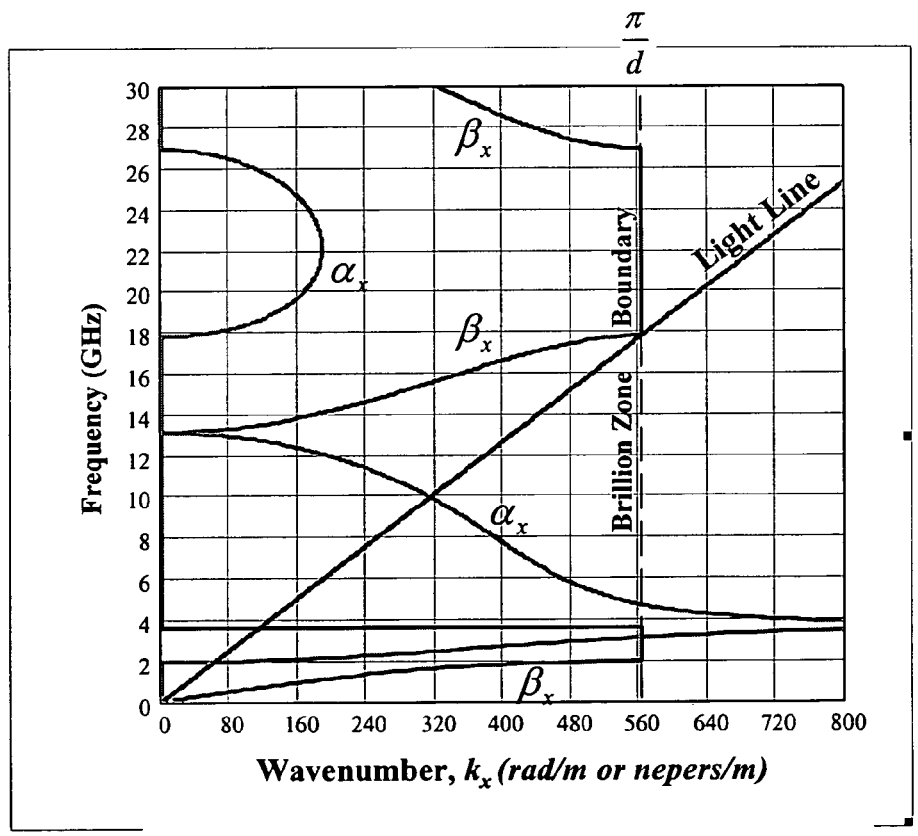
FIG. 5 is an example of an $\omega\beta$ diagram for the transmission line model of FIG. 4.

Equation (10) can be plotted to display a dispersion diagram often called an $\omega\beta$ diagram. An example is shown in FIG. 5 for the following typical parameters: d=220 mils, s=200 mils, a=40 mils, $t_1$=31 mils, $\varepsilon_{r1}$=2.2, $t_2$=2 mils, and $\varepsilon_{r2}$=4.5. The lower dielectric layer can be a laminate of polytetrafluoroethylene (PTFE) and woven fiberglass while the upper layer can be ultrathin FR4, both conventional PCB laminates available from multiple vendors. Other embodiments may be readily adapted.

FIG. 5 reveals a great deal of fundamental physics behind TEM mode wave propagation on PPWs that are loaded with shunt LC circuits. Let $jk_x = \alpha_x + j\beta_x$. The real part of $k_x$, namely, $\beta_x$, is plotted in FIG. 5. $\beta_x$ has multiple branches due to the different Rieman sheets of the inverse cosine function. The imaginary part of $k_x$, namely $\alpha_x$, is also plotted in FIG. 5. Stopbands exist where $\alpha_x$ is nonzero. The attenuation constant $\alpha_x$ defines the decay rate across a unit cell in nepers/meter as $e^{-\alpha_x d}$. However, the decay rate can be expressed in dB per unit cell using the following formula:

Atten=$-20 \log_{10}[\exp(-\alpha_x d)]$ (11)

The light line, defined by $\omega\sqrt{\varepsilon_{r,eff}}/c$ is also plotted in FIG. 5. This line defines the wavenumbers possible assuming no patches and no vias located inside the PPW, simply a two-layer dielectric medium. Beginning at zero frequency, we see that $\beta_x$ lies below the light line indicating that the TEM mode is a slow wave, traveling slower than the speed of light in a host dielectric of effective permittivity $\varepsilon_{r,eff}$. $\beta_x$ meets the edge of the irreducible Brillouin zone, $\pi/d$, near 2 GHz in frequency, where the TEM mode is cutoff since the slope for $\beta_x$ goes to zero. This is the lower edge of the fundamental stopband, denoted as $f_{lower}$. At this frequency, the attenuation constant $\alpha_x$ becomes non-zero. The attenuation constant increases dramatically with frequency until it reaches an infinite value (ideally) at a resonant frequency defined by the $L_1C_1$ product, in this case near 3.65 GHz. Above this resonant frequency, the attenuation constant decreases monotonically to a zero value at the upper edge of the fundamental stopband, denoted as $f_{upper}$, near 13 GHz. Increasing again in frequency, we observe a passband between 13.1 GHz and 18 GHz (where $\beta_x$ is nonzero but $\alpha_x$ is zero). The upper edge of this passband is found where the light line intersects the Brillouin zone boundary, $\pi/d$. At this frequency, another stopband begins. In this case, it extends from 18 GHz to near 27 GHz. Above this stopband, a third passband is observed. However, the slope for $\beta_x$ is now negative indicating backward wave propagation.

Figure 6:
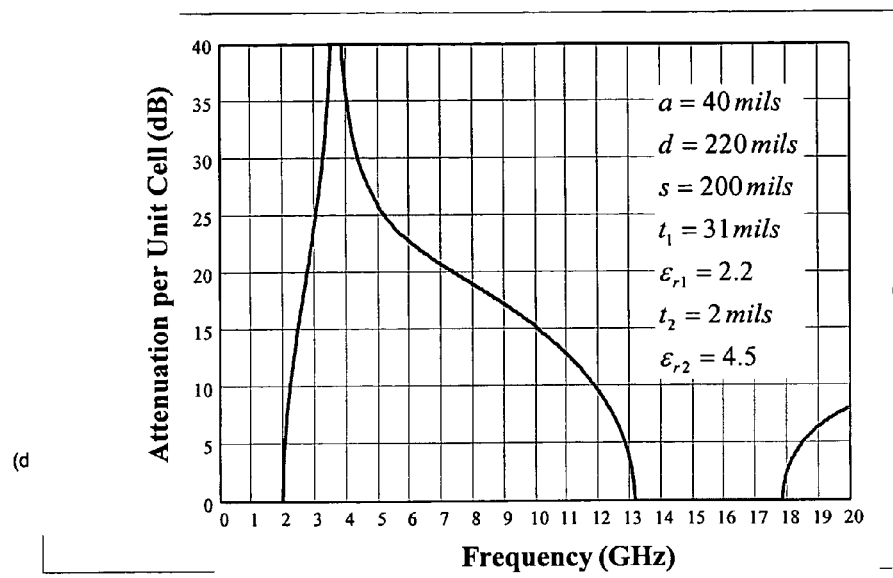
FIG. 6 shows the attenuation per unit cell of the transmission line model of FIG. 4, calculated in decibels.

One of the more useful engineering plots is the attenuation per unit cell calculated in decibels. This is shown in FIG. 6, and plotted from Equation (11).

The transmission line model 400 has at least two limitations, but they are not significant. The first limitation is that the TEM mode mentioned is really a quasi-TEM mode, meaning that its transverse field components (y and z) are much larger than its longitudinal field components (x directed) for wave propagation in the x direction. Since the PPW is an inhomogeneously filled waveguide with two different dielectric values, the possible modes can not include a strictly TEM mode, which is a mode with only transverse field components. However, since the dielectric interface within the PPW is planar, the possible modes are longitudinal section magnetic (LSM) and longitudinal section electric (LSE) which are derived from Hertzian potential functions whose pilot vector, or vector direction, is normal to the surface of the dielectric interface (z directed). More information about this classic analytical technique may be found in chapter 6 of Robert E. Collin, *Field Theory of Guided Waves*, $2^{nd}$ edition, 1999, IEEE Press. The point to be made is that the lowest order LSM mode is the quasi-TEM mode, which is referred to in this patent application only as a TEM mode.

The second limitation of the transmission line model 4000 is that the circuit model fails when fields in the PPW include higher order LSM and LSE modes, which occurs if the frequency is sufficiently high. These modes may not be attenuated by the proposed TEM mode suppression circuit. However, for PPWs realized in PCB technology where the maximum height is 1 mm and the maximum dielectric constant is 10, the cutoff frequency for the lowest order parasitic mode (non-TEM or non quasi-TEM mode) will be about 47 GHz. The cutoff frequencies for these modes can be determined exactly from the transcendental dispersion equations for LSM and LSE modes, but this is beyond the scope of the present disclosure.

It is desirable to derive explicit expressions for the edges of the fundamental stopband so as to gain insight into the relationship among design variables. The goal is to create as broad a stopband as possible. To this end, we can inspect the $\omega\beta$ diagram of FIG. 5 for values of $k_x$, and employ equation (10) to solve for frequency.

The lower edge of the stopband, $f_{lower}$, can be found by realizing that it occurs where $\mathrm{Re}\{k_x\}=\pi/d$, so the left hand side of equation (9) is then $\cos(k_x d)=\cos(\pi)=-1$. Further inspection of the $\omega\beta$ diagram reveals that the light line, $\omega\sqrt{\epsilon_{r,eff}}/c$, is far removed from the Brillouin zone boundary at this frequency. Therefore, $(\omega\sqrt{\epsilon_{r,eff}}/c)d=\beta d<<\pi$, which allows equation (10) to be simplified with small angle approximations. So the dispersion equation can be expressed as $$-1 = 1 - \frac{\omega_{lower}C_1 Z_o}{2(1-\omega_{lower}^2 L_1 C_1)}\left(\frac{\omega_{lower}}{c}\sqrt{\epsilon_{r,eff}}\,d\right) \quad (12)$$

where $\omega_{lower}=2\pi f_{lower}$. Substituting into equation (12) the expression (1) for $Z_o$, and realizing that $\eta_o/c=\mu_o$, we can solve explicitly for the lower cutoff frequency:

$$f_{lower} = \frac{1}{2\pi\sqrt{C_1\left[L_1 + \frac{\mu_o h}{4}\right]}} \quad (13)$$

So, the options to reduce the lower edge of the fundamental stopband are

Increase $C_1$ by increasing the dielectric constant $\epsilon_{r2}$
Increase $C_1$ by increasing the area $s^2$ of the patches
Increase $C_1$ by reducing the thickness $t_2$
Increase the height h of the PPW
Increase $L_1$ by decreasing the cross sectional area of the vias.

The upper edge of the fundamental stopband, $f_{upper}$, can be found by realizing that $k_x=0$, or $\cos(k_x d)=+1$ at this frequency. Thus equation (9) becomes $$+1 = \cos(\beta d) - \frac{\omega_{upper}C_1 Z_o}{2(1-\omega_{upper}^2 L_1 C_1)}\sin(\beta d), \quad (14)$$

which may be simplified to:

$$\tan\left(\frac{\beta d}{2}\right) = \frac{-\omega_{upper}C_1 Z_o}{2(1-\omega_{upper}^2 L_1 C_1)}. \quad (15)$$

If $f_{upper}$ and the resonant frequency, defined by the $L_1 C_1$ product, are widely separated, then we can use the approximation $(1-\omega_{upper}^2 L_1 C_1)\approx -\omega_{upper}^2 L_1 C_1$. Therefore, $$\tan\left(\frac{\omega_{upper}\sqrt{\epsilon_{r,eff}}\,d}{2c}\right) \cong \frac{Z_o}{2\omega_{upper}L_1} = \frac{2\pi\eta_o}{\sqrt{\epsilon_{r,eff}}\,d\mu_o\left[\ln\left(\frac{1}{\alpha}\right)+\alpha-1\right]}\frac{1}{\omega_{upper}}. \quad (16)$$

Figure 7:
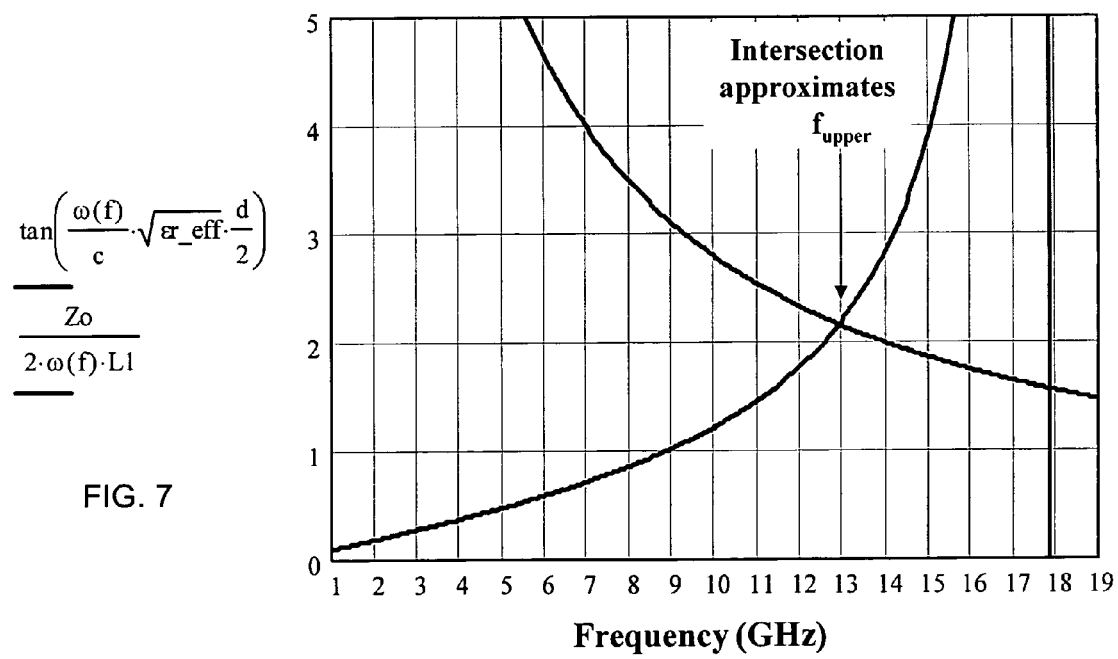
FIG. 7 is a plot of the right hand side and left hand side of equation (16)

If we plot the right hand side and the left hand side of equation (16) versus $\omega_{upper}$, we can see the tangent function intersecting the hyperbolic function at multiple points in the first quadrant. Consider the point of intersection closest to the origin, as shown in FIG. 7. This point of intersection can be moved higher in frequency by reducing the argument of the tangent function, or increasing the constant multiplying the hyperbolic function. In this case, $f_{upper}$ is approximated as 13.0 GHz, which is only 1% less than the exact value of 13.13 GHz.

So increasing $f_{upper}$ can be accomplished with the following design options:

Decrease the period d
Decrease the effective dielectric constant $\epsilon_{r,eff}$ of the PPW.
Decrease the value of $L_1$ by increasing the value of $\alpha$ (increasing the cross sectional area of the via and/or providing multiple vias for the same patch).

To obtain a broad stopband, we have reasoned that $\epsilon_{r2}$ should be increased, and yet $\epsilon_{r,eff}$ should be made as small as possible. At first this seems contradictory. However, manipulation of equation (3) allows it to be written as $$\epsilon_{r,eff} = \left(\frac{t_1+t_2}{t_1}\right)\left(\frac{1}{1+\left(\frac{\epsilon_{r1}}{\epsilon_{r2}}\right)\left(\frac{t_2}{t_1}\right)}\right)\epsilon_{r1}'. \quad (17)$$

To minimize $\epsilon_{r,eff}$, the first factor on the right hand side of (17) demands that $t_1>>t_2$. So the first factor on the right hand side goes to unity from above. If $\epsilon_{r2}\cong\epsilon_{r1}$, then the second factor on the right hand side also goes to unity, and the effective dielectric constant of the PPW approaches $\epsilon_{r1}$.

If we allow $\epsilon_{r2} \gg \epsilon_{r1}$ to support a high value of $C_1$, then the result still holds that $\epsilon_{r,eff} \cong \epsilon_{r1}$.

Accordingly, to achieve the broadest stopband possible we should let $t_1 \gg t_2$ and $\epsilon_{r2} \gg \epsilon_{r1}$. In one embodiment, the distance $t_2$ between the upper conductive plate and the conductive patches is chosen to maximize capacitance $C_1$ between the conductive coplanar patches and the upper conductive plate. One way to achieve this is to minimize the thickness $t_2$ of the upper dielectric layer. Capacitance may be optimized by any suitable method, including substantially maximizing the stopband ratio, reducing the lower edge $f_{lower}$ of the fundamental stopband or substantially minimizing $f_{upper}$, increasing the upper edge $f_{upper}$ of the fundamental stopband or substantially maximizing $f_{upper}$, or otherwise. Other methods for achieving the broadest stopband include reducing or substantially minimizing the dielectric constant $\epsilon_{r1}$ between the conductive coplanar patches and the lower conductive plate where the vias are located, increasing the height h of the PPW, increasing the dielectric constant $\epsilon_{r2}$, increasing the area $s^2$ of the patches or by increasing the cross sectional area of the vias or rods or adding multiple vias in each.

In another embodiment, 80% of the total thickness h of the PPW is assigned to $t_1$, the thickness of the thicker dielectric layer containing the vias, and 20% of the total thickness h of the PPW is assigned to $t_2$, the thickness of the dielectric layer between the patches and the upper plate. That is, the thickness $t_2$ is of the dielectric layer between the patches and the upper conductive plate is no more than 20% of the height of the parallel plate waveguide. Put another way, the array of rods or vias 108 span at least 80% of the height h between the parallel plates 102, 104. In yet another embodiment, the total thickness h of the PPW is approximately 0.5 mm to 2 mm and the thickness $t_2$ is less than about 0.1 mm. Other relative and absolute values may be used as well.

Another way to characterize the required optimization to maximize the bandwidth of the fundamental stopband is to maximize the ratio $$\frac{\epsilon_2/t_2}{\epsilon_1/t_1}.$$

In some embodiments, the thickness $t_2$ may be less than or equal 0.1 mm. This can result in a parallel plate waveguide having a total thickness of 0.5 mm assuming conservatively that $\epsilon_{r2} \cong \epsilon_{r1}$ and assuming the 80% rule of the previous paragraph.

Figure 8:
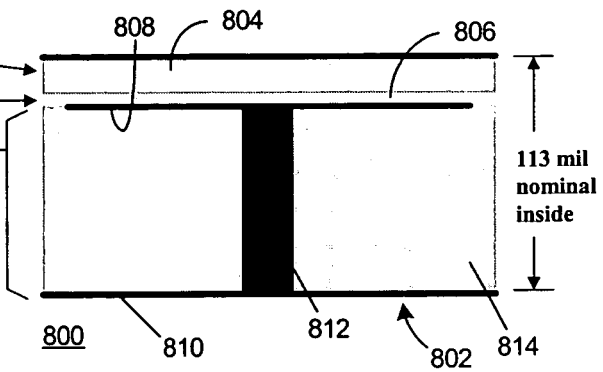
FIG. 8 illustrates an experimental embodiment of a transverse electromagnetic (TEM) mode suppression circuit in a parallel plate waveguide.

FIG. 8 illustrates a second exemplary embodiment of a parallel plate waveguide 800. The PPW 800 was used to help validate the transmission line model described above. The waveguide 800 was built using existing, readily available, artificial magnetic conductor (AMC) materials. A 5 GHz AMC 802 was chosen and bonded to a 15 mil FR4 superstrate 804 using a 3 mil layer of acrylic pressure sensitive adhesive (PSA) 806. Details of the stack-up are shown in FIG. 8. The AMC 802 has a pattern of square patches 808 repeated with a period of 315 mils (8 mm). The gap between patches 808 is 30 mils (0.75 mm). Each patch is square, sized 7.25 mm per side. Each patch 808 is connected to a conductive backplane 810 by a via 812. The via diameter is 20 mils (0.5 mm). The vias 812 extend through a dielectric core 814 made of FR4. The total thickness of the AMC 802 is 93 mils or 2.36 mm. These measurements and materials are exemplary only.

Figure 9:
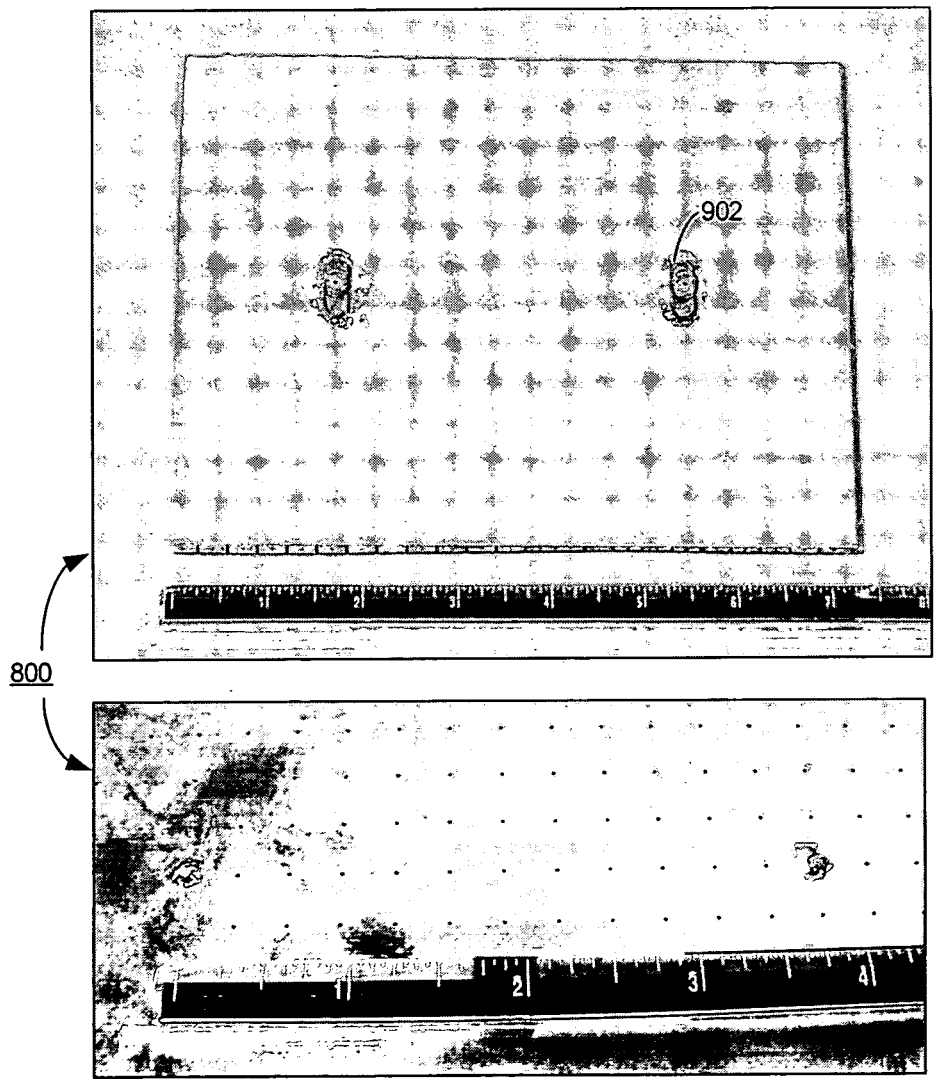
FIG. 9 is a photograph of the parallel plate waveguide of FIG. 8.

The PPW 800 was cut to the approximate dimensions of 15.5 inches by 7.25" (17 by 23 unit cells of the AMC). FIG. 9 is two photographs of the parallel plate waveguide 800 of FIG. 8. The top photograph in FIG. 9 shows the top view of the PPW 800; the bottom photograph shows the bottom view of the PPW 800. Two SMA connectors 902 were soldered to the PPW 800 with a separation distance of 12 unit cells or 3.78". They were centered on drilled-out vias. The center conductor for each connector 902 was soldered to the bottom plate or backplane 810 of the PPW 800 so as to efficiently excite or receive TEM modes. Each connector was located at least 5 unit cells from the nearest edge. Again, the materials and geometries are exemplary only.

Figure 10:
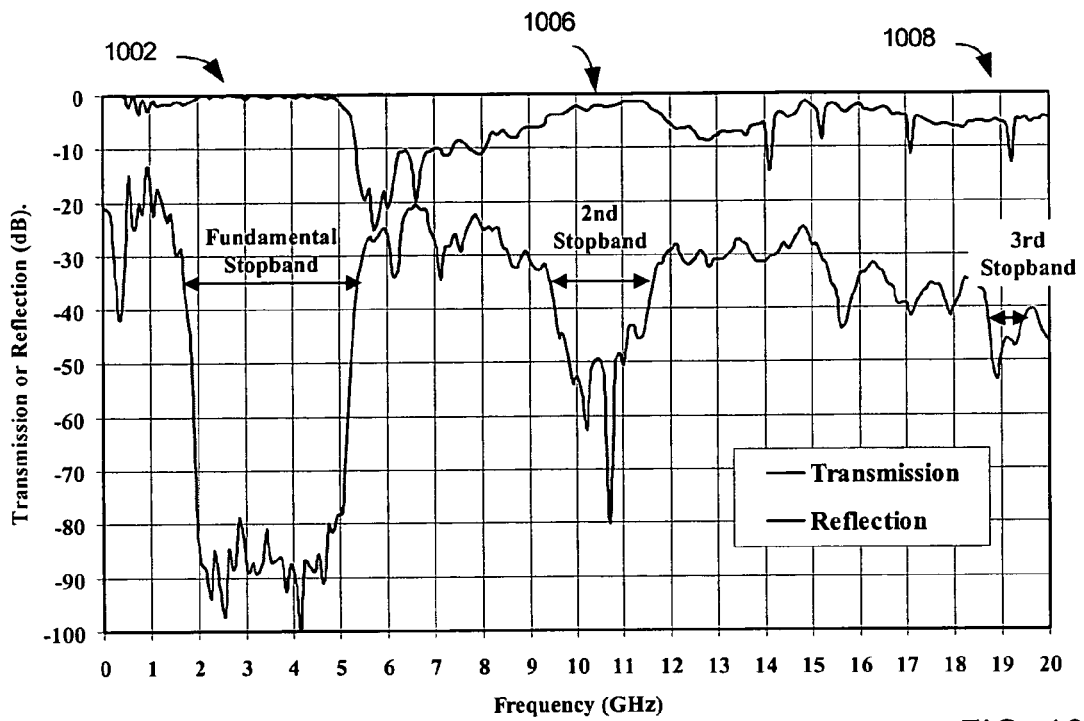
FIG. 10 shows measured transmission and reflection for the parallel plate waveguide of FIG. 9.
Figure 11:
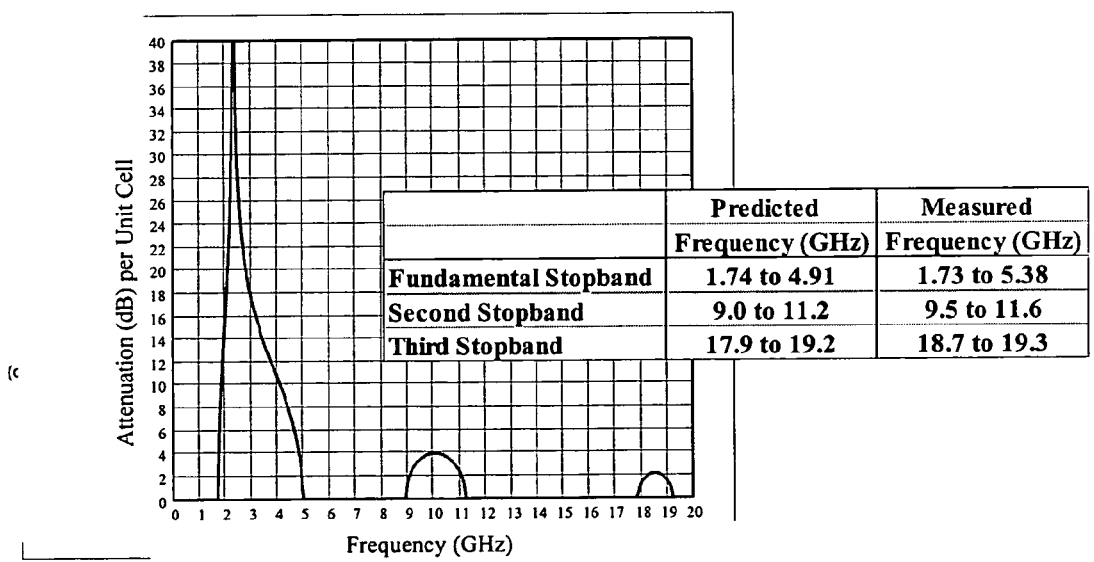
FIG. 11 illustrates predicted attenuation in dB per unit cell and a comparison of predicted to measure stopband frequencies for the parallel plate waveguide of FIGS. 8 and 9.

FIG. 10 shows the measured transmission (S21 magnitude) and reflection (S11 magnitude) from 50 MHz to 20 GHz for the PPW 800 of FIGS. 8 and 9. Three stopbands 1002, 1006, 1008 are clearly visible in the transmission curve, with the fundamental stopband 1002 extending from approximately 1.8 GHz to 5.4 GHz. This is a bandwidth ratio of 3:1, which equals or exceeds any published results to date. FIG. 11 illustrates predicted attenuation in dB per unit cell and a comparison of predicted to measure stopband frequencies. The predicted values are based on the transmission line model described above. Below 20 GHz, three stopbands are both predicted and measured, with the widest and deepest stopband being the fundamental stopband. The depth of the fundamental stopband was too deep to be directly measured in this embodiment, but the predicted value of at least 100 dB of attenuation over 2 to 4 GHz is consistent with the measured data.

Thus, a good comparison can be made between predicted and measured stopbands. Assumptions made with the model to achieve this level of agreement include the following:

The 15 mil FR4 superstrate 804 has an $\epsilon_r = 4.3$ The 3 mil PSA 806 has an $\epsilon_r = 3.0$ The superstrate/PSA combination has an effective dielectric constant of 4.01, which is computed using the method of equation (3).

The FR4 core 814 of the AMC 802 has an $\kappa_r = 4.5$.

The effective dielectric constant of the PPW 800, $\epsilon_{r,eff}$, was computed using all three dielectric layers and thicknesses.

Other patch shapes can be used to implement parallel-plate capacitors. Exemplary shapes include triangular, rectangular, hexagonal, trapezoid, etc. Other shapes may be used as well. Two examples are shown in FIGS. 12 and 13 and FIGS. 14 and 15. It should be noted that inverting the structure to place the capacitive patches near the lower parallel plate will not change the RF performance of this TEM mode suppression circuit. In some applications, this may be a more desirable option based on the mechanical tolerances of a multi-layer PCB.

Figure 12:
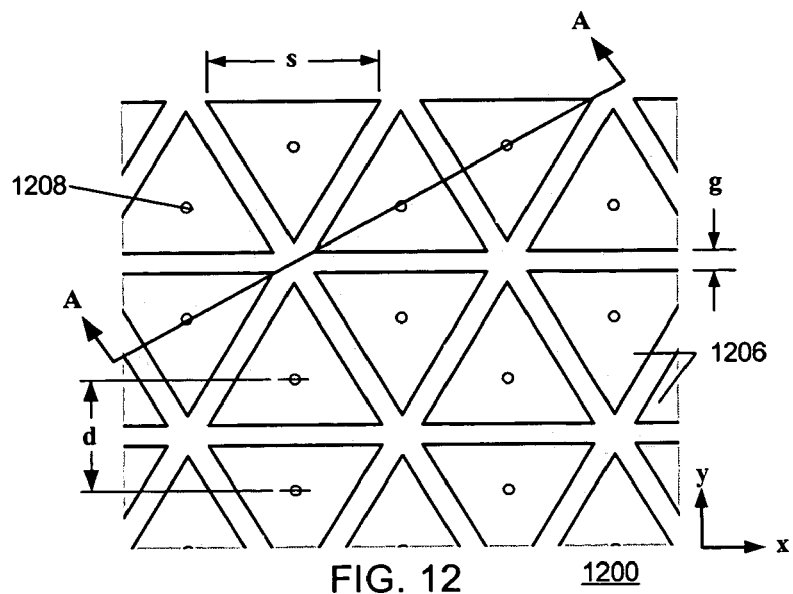
FIG. 12 and FIG. 13 illustrate a second embodiment of a TEM mode suppression circuit.
Figure 13:
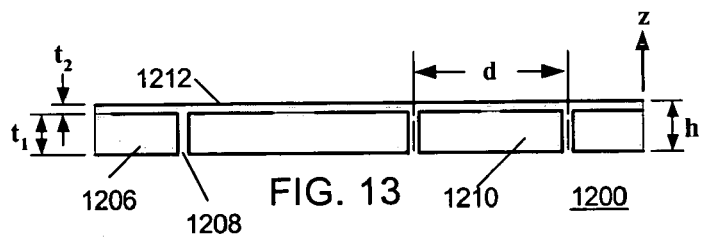

FIG. 12 and FIG. 13 illustrate a second embodiment of a parallel plate waveguide (PPW) 1200. FIG. 12 is a top view of the PPW 1200 and FIG. 13 is a cross section view taken along the line A—A in FIG. 12. The second embodiment of the PPW 1200 uses triangular patches with vias arranged on a hexagonal lattice.

The PPW 1200 includes an upper conductive plate and a lower conductive plate which are not shown in FIG. 12 so as to not unduly complicate the drawing figures. The PPW 1200 further includes an array of conductive coplanar patches 1206 located a distance $t_2$ from the upper plate, an array of conductive rods or vias 1208 of length $t_1$ and radius a that connect the lower plate to the center of each patch 1206, a first dielectric layer 1210 and a second dielectric layer 1212. The patch 1206 realizes a parallel-plate capacitance between the end of the rod 1208 below it and the upper plate of the PPW 1200. As noted, the patches 1206 and rods 1208 in the embodiment of FIGS. 12 and 13 are arrayed in a hexagonal lattice of period d. The total height of the PPW 1200 is denoted as h. Also, the two dielectric layers 1210, 1212 form the host dielectric medium of the PPW 1200. The first or lower layer 1212 of thickness $t_1$, containing the rods 1208, has a relative dielectric constant of $\in_{r1}$, while the upper layer 1212 of thickness $t_2$ has a relative dielectric constant of $\in_{r2}$.

Figure 14:
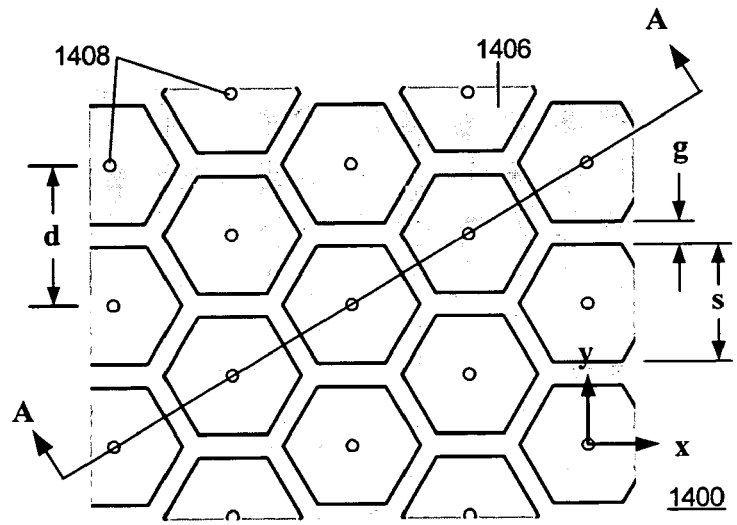
FIG. 14 and FIG. 15 illustrate a third embodiment of a TEM mode suppression circuit.
Figure 15:
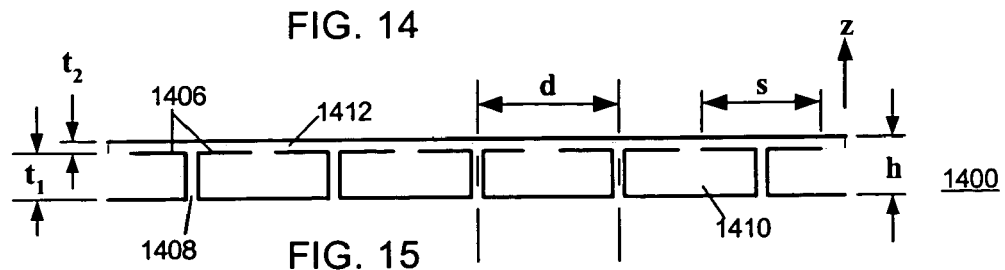

FIG. 14 and FIG. 15 illustrate a third embodiment of a parallel plate waveguide 1400. FIG. 14 is a top view of the PPW 1400 and FIG. 15 is a cross section view taken along the line A—A in FIG. 14. The third embodiment of the PPW 1200 uses hexagonal patches with vias arrayed on a triangular lattice.

The PPW 1400 includes an upper conductive plate and a lower conductive plate which are not shown in FIG. 14. The PPW 1400 further includes an array of conductive coplanar patches 1406 located a distance $t_2$ from the upper plate, an array of conductive rods or vias 1408 of length $t_1$ and radius a that connect the lower plate to the center of each patch 1406, a first dielectric layer 1410 and a second dielectric layer 1412. The patch 1406 realizes a parallel-plate capacitance between the end of the rod 1408 below it and the upper plate of the PPW 1400. As noted, the patches 1406 and rods 1408 in the embodiment of FIGS. 14 and 15 are arrayed in a triangular lattice of period d. The total height of the PPW 1400 is denoted as h. Also, the two dielectric layers 1410, 1412 form the host dielectric medium of the PPW 1400. The first or lower layer 1412 of thickness $t_1$, containing the rods 1408, has a relative dielectric constant of $\in_{r1}$, while the upper layer 1412 of thickness $t_2$ has a relative dielectric constant of $\in_{r2}$.

Yet another embodiment involves adding a spiral inductor in series with each via, as shown in FIGS. 16 and 17. The purpose of this added inductance is to reduce $f_{lower}$. FIG. 16 and FIG. 17 illustrate a fourth embodiment of a parallel plate waveguide (PPW) 1600. The PPW 1600 includes an upper conductive plate and a lower conductive plate (not shown in FIG. 16). The PPW 1600 includes an array of conductive coplanar patches 1606 located a distance $t_2$ from the upper plate, an array of conductive rods or vias 1608 of length $t_1$ and radius a that connect the lower plate to the center of each patch 1606, a first dielectric layer 1610 and a second dielectric layer 1612. The PPW 1600 further includes a spiral inductor 1612 associated with each respective patch 1606 and via 1608.

In the embodiment of FIGS. 16 and 17, the inductors 1614 and patches are coplanar and are etched as part of the same metal layer. The coplanar spiral inductor 1614 is formed within the perimeter of the patch 1606. The merit of an embedded spiral inductor 1614 is to lower the parameter $f_{lower}$ without increasing the period or distance between the rods. To form the inductor 1614, any inductive trace can be used in series with the via 1608, such as a meanderline, or simply a straight narrow trace. The spiral inductor 1614 could also be wrapped around the perimeter of each patch 1616 for added inductance. Any other technique for forming inductive elements in a printed circuit board or similar technology may be used as well. However, these inductive elements should be in series between the vias and the patches.

According to the analysis above, to increase the bandwidth of the fundamental stopband, the capacitance $C_1$ may be increased to lower $f_{lower}$ while simultaneously decreasing the period d to increase $f_{upper}$. FIG. 18 is an embodiment of a TEM mode suppression circuit containing two levels of capacitive patches. This embodiment simultaneously achieves these apparently opposing goals. FIG. 18 is a cross sectional view of the TEM mode suppression circuit 1800 and shows a PPW containing two coplanar layers of internal capacitive patches 1802, 1804. Each layer of patches 1802, 1804 is connected with vias to the farthest plate in the PPW. The patches 1802 are connected with vias 1806 and the patches 1804 are connected with vias 1808. The PPW 1800 includes an upper conductive plate 1810 and a lower conductive plate 1812. The vias 1804 are electrically connected to the upper conductive plate 1810. A dielectric layer 1814 having a thickness $t_2$ separates the patches 1802 and the upper conductive plate 1810. The vias 1806 are electrically connected to the lower conductive plate 1812. A dielectric layer 1816 having a thickness $t_2$ separates the patches 1804 and the lower conductive plate 1812. A dielectric layer 1818 separates the patches 1802, 1804 and contains the rods 1806, 1808 and has a thickness $t_1$.

The dual-layer capacitors formed by the patches 1802, 1804 permit an increase in shunt capacitance of the LC branches of the transmission line model of FIG. 4 without resorting to high permittivity dielectric layers. The PPW of FIG. 18 increases the capacitance $C_1$ to lower $f_{lower}$ while decreasing the period d to increase $f_{upper}$.

Many modern printed circuit board designs use only an even number of power and ground metal layers. It has been found that using only even numbers (e.g., 2, 4, 6, 8) of layers, PCB warpage is reduced and durability and flatness improved. In these applications, the TEM mode suppression circuit 1800 of FIG. 18 with a PPW containing two coplanar layers of internal capacitive patches 1802, 1804 may be preferred for use in such PCB designs because the circuit 1800 adds an even number of layers to an existing board design and can thus readily be integrated with such existing board designs while maintaining the advantage provided by the use of only even numbers of metal layers.

In other embodiments, the patches can be arrayed in multiple ways. FIG. 19 is another embodiment of a TEM mode suppression circuit 1900 containing two levels of capacitive patches, including patches 1902 on a first layer and patches 1904 on a second layer. This exemplary embodiment uses a square lattice of square patches 1902, 1904 for each level with period d as shown in FIG. 19. The patches are identical in size for each layer. Each patch 1902, 1904 has an associated via 1906, 1908, respectively. As in other embodiments described herein, the vias 1906, 1908 are still arrayed in a square lattice. However, in the embodiment of FIG. 19, the principal axes are the x' and y' axes, and the via period is reduced to d'=d/$\sqrt{2}$.

TEM mode wave propagation in the x' or y' directions can be modeled using the familiar equivalent circuit of FIG. 4 with d replaced by d'. The stopband analysis for this more complex embodiment parallels the development of the transmission line model above, with the following minor changes.

The effective dielectric constant is now determined by the series combination of 3 dielectric layers:

$$\varepsilon_{r,eff} = \frac{h}{\frac{t_2}{\varepsilon_{r2}} + \frac{(h-2t_2)}{\varepsilon_{r1}} + \frac{t_2}{\varepsilon_{r2}}}. \tag{18}$$

Assume that the dielectric constant $\in_{r2}$ for the thinner dielectric layers of thickness $t_2$ is identical for the top and bottom layers. If this assumption is not true, the period becomes 2d' and the analysis becomes more complex.

The inductance parameter α is now a larger value since the unit cell is smaller:

$$\alpha = \frac{\pi a^2}{(d')^2} \quad (19)$$

The capacitance $C_1$ is calculated using a patch area of $s^2=(d'\sqrt{2}-g)^2$ where g is the gap between patches on each layer. It is assumed that the gap is wider than the via diameter, or else the patch corners are rebated to avoid an electrical short between the patches and vias that lead to a DC short between the parallel plates 1810 and 1812. Rebated corners can take the form of a 45° miter, a square cutout, a circular arc, or other geometric shapes.

Figure 20:
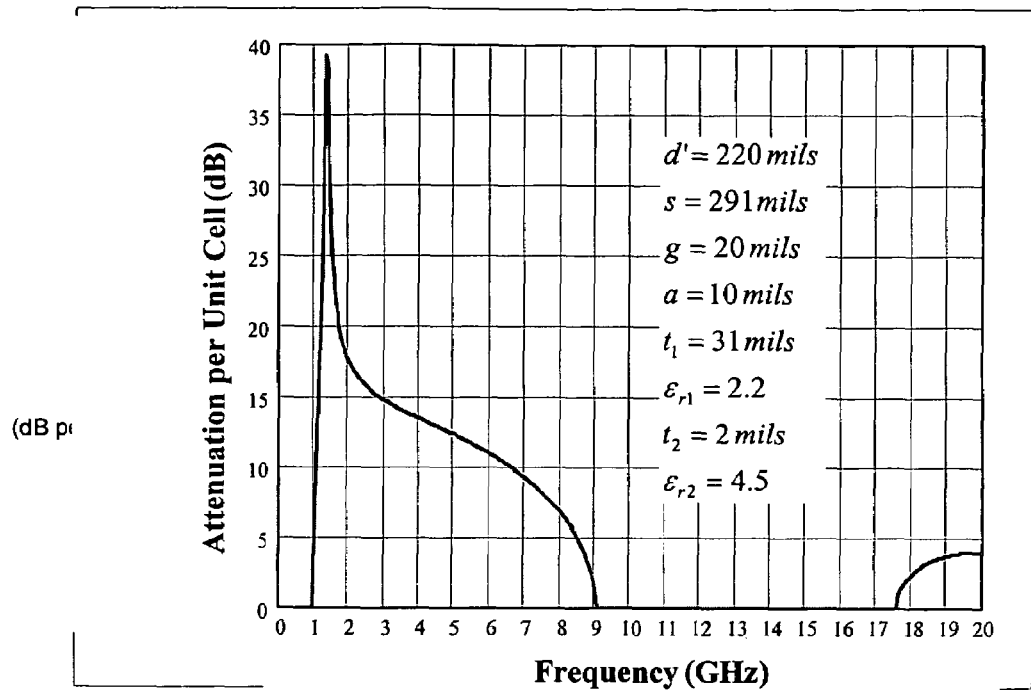
FIG. 20 shows attenuation per unit cell for the embodiment of FIGS. 18 and 19.

To demonstrate the bandwidth enhancement afforded by the dual-layer patch design of FIG. 19, assume the use of the same dielectric layer components (permittivity and thickness) as used in the example of FIG. 6. FIG. 20 shows the attenuation per unit cell for the TEM mode suppression circuit of FIG. 19. The attenuation plot of FIG. 20 reveals a 9:1 stopband bandwidth ranging from below 1 GHz to 9 GHz. This exceeds the 6.6:1 stopband bandwidth obtained using a single layer of patches such as the embodiment of FIG. 2 with parameters shown in FIG. 6 where the period and total thickness are the same.

Many other design permutations are possible based on the embodiments disclosed herein. For instance, the patches of a dual-layer design, such as the embodiments of FIGS. 18 and 19, can have any polygonal shape, such as triangular, hexagonal, trapezoid, or other, or even a circular shape. One design goal is simply to maximize capacitance for a given via period d'.

All of the above square lattice designs exhibit a single transmission zero at $f=1/(2\pi\sqrt{L_1 C_1})$ where the attenuation becomes infinite. However, if the shunt loading circuit is modulated in a periodic manner, multiple transmission zeros should be possible. This can be realized by using non-uniform patch sizes, non-uniform patch types (such as hexagonal and triangular), by using non-uniform via diameters, or by using combinations of the above methods. Distributing the transmission zeros can create a broader fundamental stopband. Multiple transmission zeros have not been suggested or demonstrated in prior art on power plane noise suppression circuits.

One practical concept to modulate the shunt loading is to employ a nonuniform array of square patches, each of which is connected to a uniform array of vias. One example of this is illustrated in FIGS. 21 and 22, which show a parallel plate waveguide 2100 with non-uniform patches to create a modulated shunt load with period 2d. FIG. 21 is a top view of the PPW 2100 and FIG. 22 is a cross section view of the PPW 2100 taken through the line A—A in FIG. 21. The PPW 2100 includes patches 2102 and patches 2104. The patches 2102 are substantially square and have a side dimension $s_1$. The patches 2104 are substantially square and have a side dimension $s_2$ which is smaller than $s_1$. The PPW 2100 further includes vias 2106 associated with the patches 2102 and vias 2108 associated with the patches 2104. The PPW 2100 also includes a top conductive layer and a top dielectric layer 2110 isolating the patches 2102, 2104 from the top conductive layer. The top conductive layer and the dielectric layer 2110 are not shown in the plan view of FIG. 21. A dielectric layer 2112 contains the vias 2106, 2108 and isolates the patches from a lower conductive layer.

There are many possible configurations of a doubly periodic capacitive shunt load. However, the embodiment of FIGS. 21 and 22 has a uniform gap 2114 between all patches 2104, 2106 to promote the maximum capacitance possible for a given minimum gap size. The design illustrated in the exemplary embodiment of FIGS. 21 and 22 is very flexible with respect to capacitance ratios since there is no restriction on the relationship between the two patch sizes $s_1$ and $s_2$. In fact, if we allow $s_1$ and $s_2$ to be equal, the FIG. 21 embodiment becomes the embodiment of FIG. 1.

In the illustrated embodiment, patches 2104, 2106 are rectilinear in the x'y' coordinate system. However, the vias 2106, 2108 that are located at the center of each patch have orthogonal principal axes x and y which are rotated with respect to the x'y' coordinate system, as illustrated in FIG. 21. This structure is actually periodic in the x-y coordinate system with a period of 2d. As a result, TEM mode wave propagation in the x or y directions can be calculated using the equivalent circuit shown in FIG. 23.

The period d may be calculated using the Pythagorean Theorem:

$$d = \sqrt{\left(\frac{s_1 - s_2}{2}\right)^2 + \left(\frac{s_1 + s_2}{2} + g\right)^2} \quad (20)$$

The effective phase constant $k_x$ for the x or y directions may be calculated from the ABCD parameters of the network shown in FIG. 18.

$$\begin{bmatrix} A & B \\ C & D \end{bmatrix} = \begin{bmatrix} \cos\left(\beta\frac{d}{2}\right) & jZ_o\sin\left(\beta\frac{d}{2}\right) \\ \frac{j}{Z_o}\sin\left(\beta\frac{d}{2}\right) & \cos\left(\beta\frac{d}{2}\right) \end{bmatrix} \cdot \begin{bmatrix} 1 & 0 \\ Y_1 & 1 \end{bmatrix} \cdot \begin{bmatrix} \cos(\beta d) & jZ_o\sin(\beta d) \\ \frac{j}{Z_o}\sin(\beta d) & \cos(\beta d) \end{bmatrix} \cdot \begin{bmatrix} 1 & 0 \\ Y_2 & 1 \end{bmatrix} \cdot \begin{bmatrix} \cos\left(\beta\frac{d}{2}\right) & jZ_o\sin\left(\beta\frac{d}{2}\right) \\ \frac{j}{Z_o}\sin\left(\beta\frac{d}{2}\right) & \cos\left(\beta\frac{d}{2}\right) \end{bmatrix} \quad (21)$$

This analysis parallels the derivation of the transmission line model of FIG. 4 with two minor exceptions. First, the admittances $Y_1(\omega)$ and $Y_2(\omega)$ are calculated from equation (7) using lumped capacitances $C_1$ and $C_2$ which in turn are calculated from equation (4) using patch side lengths $s_1$ and $s_2$ respectively. Second, the effective phase constant is calculated from $$k_x = \frac{1}{2d}\cos^{-1}[A(\omega)] \quad (22)$$

using a period of 2d.

Figure 24:
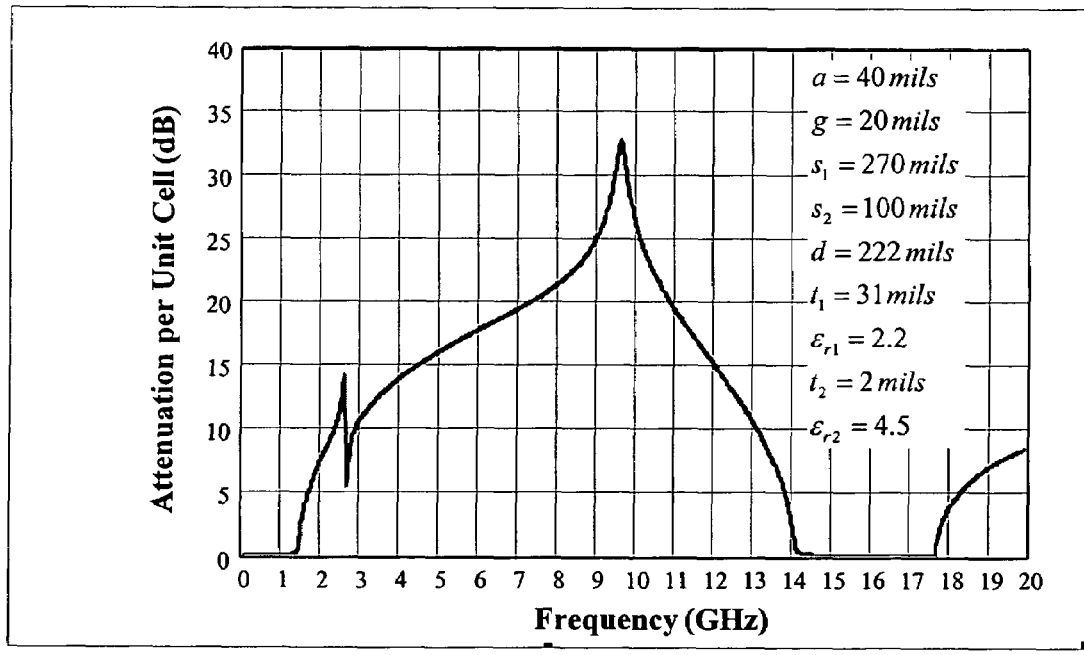
FIG. 24 shows a plot of attenuation per unit cell for the embodiment of FIGS. 21 and 22.

Finally, the attenuation can be calculated from (11). FIG. 24 shows a plot of attenuation per unit cell for the embodiment of FIGS. 21 and 22. In this embodiment, the PPW has typical parameters as shown in the figure. The PPW has $f_{lower}$=1.5 GHz, $f_{upper}$=14 GHz. A loss tangent of 0.02 is included in layer 2. This loss suppresses the resonance near 2.7 GHz. FIG. 24 shows an example were the via period remains about 220 mils for comparison to FIGS. 6 and 20, but the patches are now 100 ($s_1$) and 270 ($s_2$) mils square. As can be seen in FIG. 24, this dual-periodic structure shows a stopband bandwidth in excess of 9:1 with only one layer of patches. The transmission zeros are near 2.6 GHz and 9.7 GHz.

Figure 25:
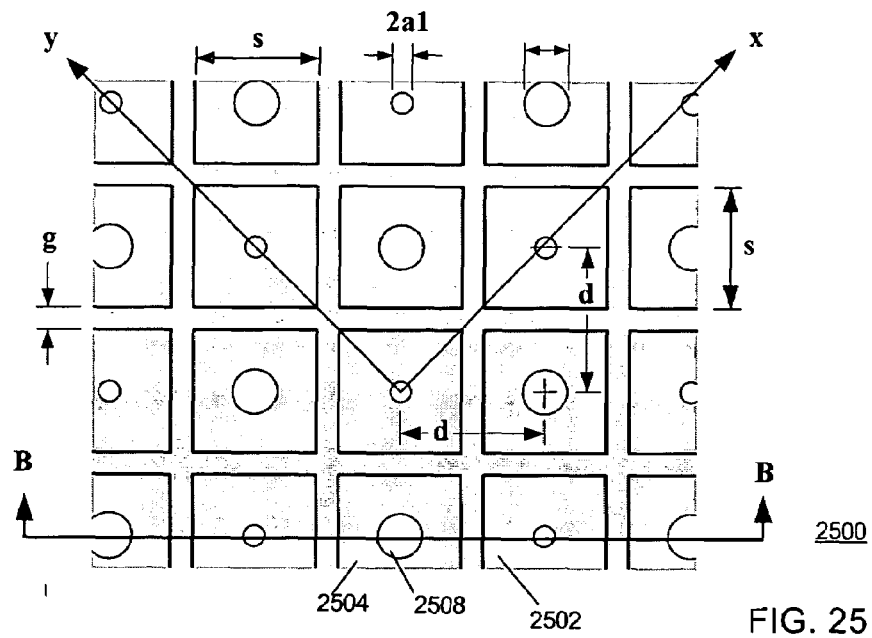
FIGS. 25–26 illustrate a TEM mode suppression circuit having vias of non-uniform diameters.
Figure 26:
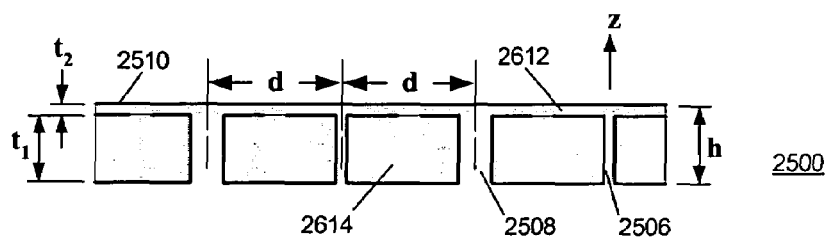
Figure 27:
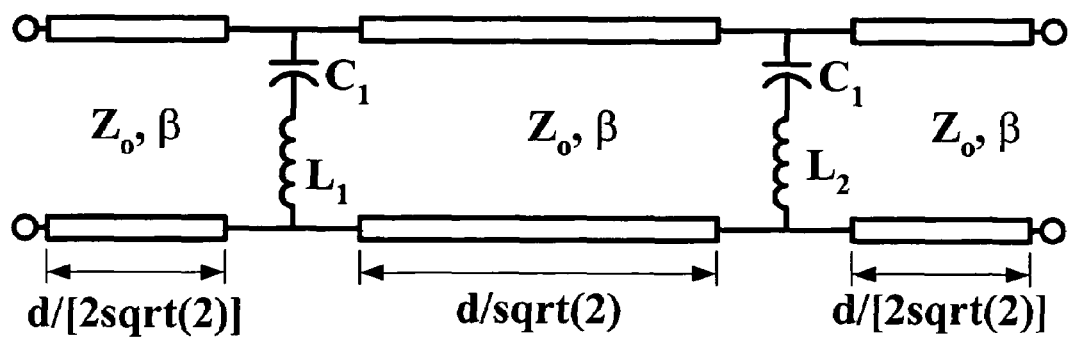
FIG. 27 is an equivalent circuit shown for the parallel plate waveguide of FIGS. 25 and 26.

FIGS. 25–26 illustrate a TEM mode suppression circuit 2500 having vias of non-uniform diameters. FIG. 25 is a top view of the TEM mode suppression circuit 2500 and FIG. 26 is a cross section view of the TEM mode suppression circuit 2500 taken through the line B—B in FIG. 25. FIG. 27 is an equivalent circuit 2700 for the parallel plate waveguide of FIGS. 25 and 26.

The TEM mode suppression circuit 2500 includes patches 2502 and patches 2504. Vias 2506 are associated with the patches 2502. Vias 2508 are associated with the patches 2504. The patches 2502, 2504 are substantially square and have a side dimension s. The patches 2504 are substantially square and have a side dimension s which in this example is the same as the side dimension s of the patches 2502. The PPW 2500 also includes a top conductive 2510 layer and a top dielectric layer 2612 isolating the patches 2502, 2504 from the top conductive layer 2510. The top conductive layer 2510 and the dielectric layer 2612 are not shown in the plan view of FIG. 26. A lower dielectric layer 2614 contains the vias 2506, 2508 and isolates the patches from a lower conductive layer.

In the example of FIGS. 25 and 26, non-uniformly sized vias 2506, 2508 are attached to uniform patches. More specifically, the vias have two different diameters, $2a_1$ and $2a_2$, and each is arrayed in a checkerboard pattern.

The equivalent circuit model of FIG. 27 now has two different values of shunt inductance, $L_1$ and $L_2$, but the same value of shunt capacitance $C_1$. The inductances $L_1$ and $L_2$ are associated with the smaller and larger diameter via 2506, 2508, respectively of radius $a_1$ and $a_2$. Since the unit cell area is the same for each via, the parameters $a_1$ and $a_2$ are determined by $$\alpha_1 = \pi a_1^2 / d^2 \quad \alpha_2 = \pi a_2^2 / d^2$$

Inductances can then be calculated from $$L_{1,2} = \frac{\mu_o (h - t_2)}{4\pi} \left[ \ln\left(\frac{1}{\alpha_{1,2}}\right) + \alpha_{1,2} - 1 \right]$$

Again, the LC product is different for each of the two shunt branches, and each product defines a transmission zero.

Figure 28:
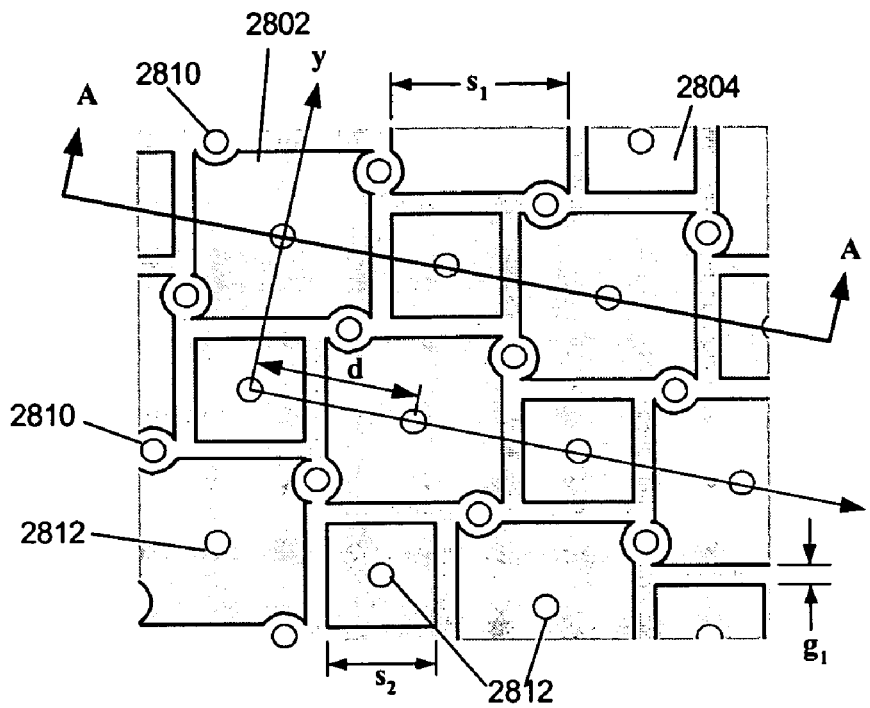
FIGS. 28–30 illustrate a TEM mode suppression circuit having dual-layer patches with non-uniform loading.
Figure 29:
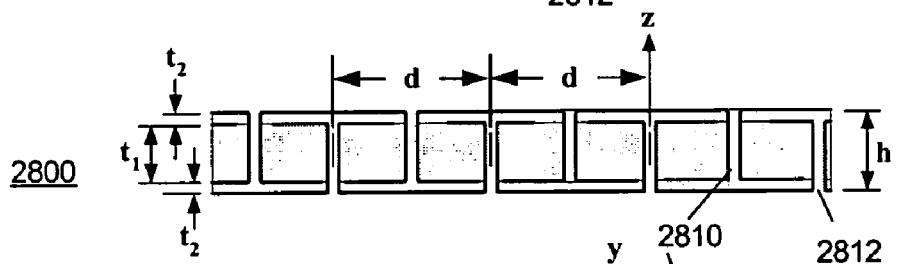
Figure 30:
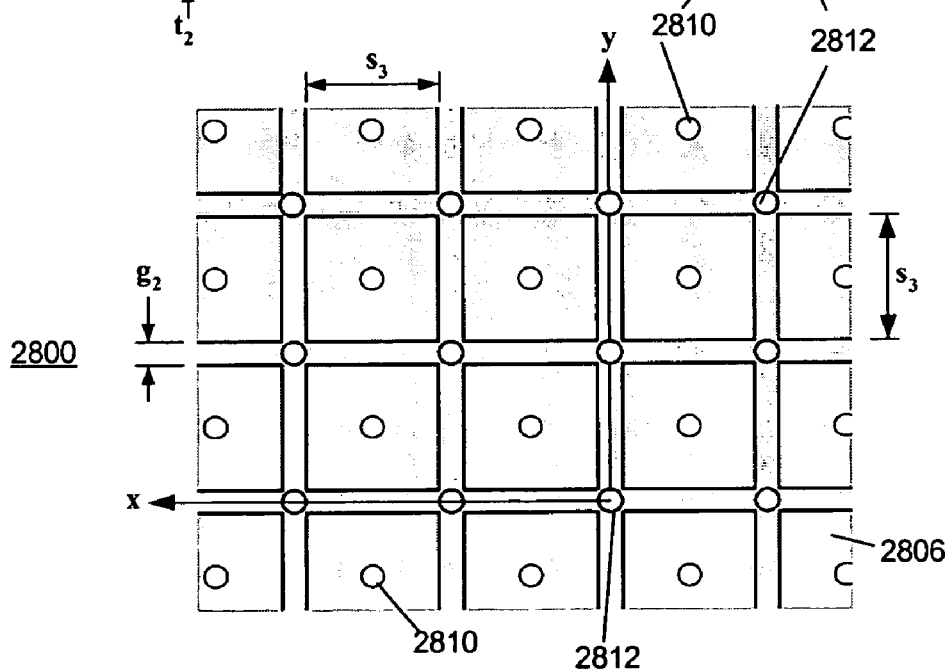

The concepts behind the embodiments having four metal layers and embodiments having non-uniform loading can be combined to gain further performance advantages in a TEM mode suppression circuit. One exemplary combination is the dual-layer capacitor embodiment of FIG. 18 in combination with the dual-periodic patches of FIG. 21. An example is shown in FIGS. 28–30, which illustrate a TEM mode suppression circuit 2800 having dual-layer patches with non-uniform loading in the upper layer. The circuit 2800 has a first or upper layer of patches 2802, 2804 and a second layer of patches 2806. The upper layer of patches 2802, 2804 is shown in FIG. 28. The patches are non-uniform. The patches 2802 are relatively larger in size, with a side dimension $s_1$. The patches 2804 are relatively smaller in size, with a side dimension $s_2$. All the patches 2802, 2804 of the first layer are spaced by a uniform gap $g_1$. The lower layer of patches 2806 is shown in FIG. 30. The patches 2806 of the lower layer have a uniform size $s_3$ and are spaced by a uniform gap $g_2$. FIG. 29 is a cross sectional view taken along the line A—A in FIG. 28. In FIG. 28, the upper conductive plate and the upper dielectric layer are omitted. Similarly, in FIG. 30, the lower conductive plate and the lower dielectric layer are omitted.

Associated with the patches 2806 are vias 2810. Similarly, associated with the patches 2808 are vias 2812. The vias are positioned in the middle of the associated patches. Other embodiments or configurations of the patches and vias may be used as well to provide different performance features. For example, one or more vias per patch may be arbitrarily located within each patch boundary.

Figure 31:
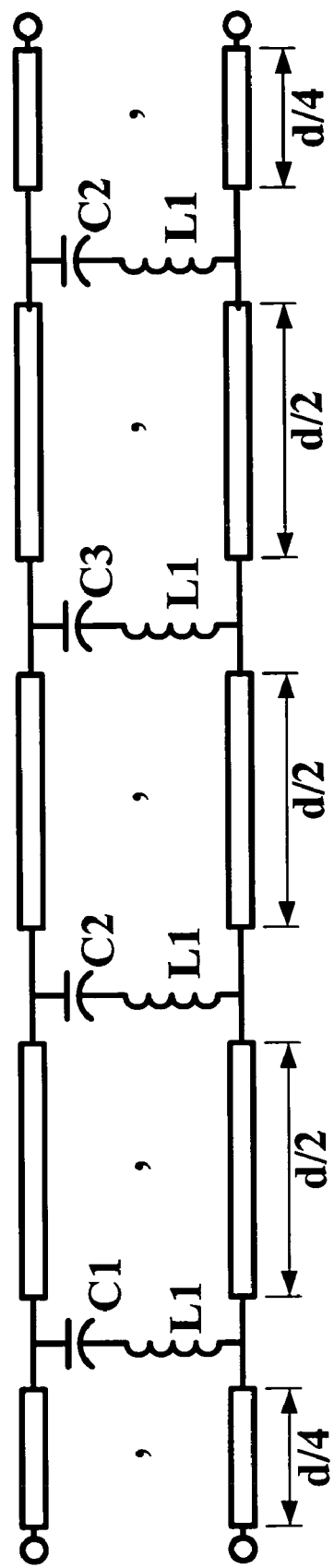
FIG. 31 is an equivalent circuit for the TEM mode suppression circuit of shown in FIG. 25.

FIG. 31 illustrates an equivalent circuit modeling one unit cell for wave propagation along the x or y directions of the PPW 2800 of FIG. 28. Consider the x direction with the $L_1C_1$ branch at the origin were $C_1$ models the smaller patches 2804. $C_2$ models the capacitance between the patch 2806 and the lower plate. $C_3$ models the capacitance between the patch 2802 and the upper plate. In a given unit cell, there are four shunt branches, and three of the four have unique LC products. Thus there can be up to three transmission zeros for this embodiment, which allows more degrees of freedom in the design of the fundamental stopband. The analysis of this embodiment is similar to what is shown above in connection with FIG. 4 where the ABCD parameters are calculated, and the effective propagation constant is then calculated from the A term. In the most general case, patches on both layers can be non-uniform, but each layer can have different ratio, $s_1/s_2$, of patch sizes.

Embodiments of the TEM mode suppression circuits shown herein are formed using multiple layer printed circuit boards (PCBs) which include vias whose illustrated length is the minimum necessary to achieve the desired electrical connection. As such, these vias are drawn as blind vias which are defined as vias which do not penetrate the entire height of the PCB structure. However, to reduce cost, or to achieve a lower value of thickness $t_2$, it may be preferred to implement a conventional plated through hole that connects all metal layers together.

Figure 32:
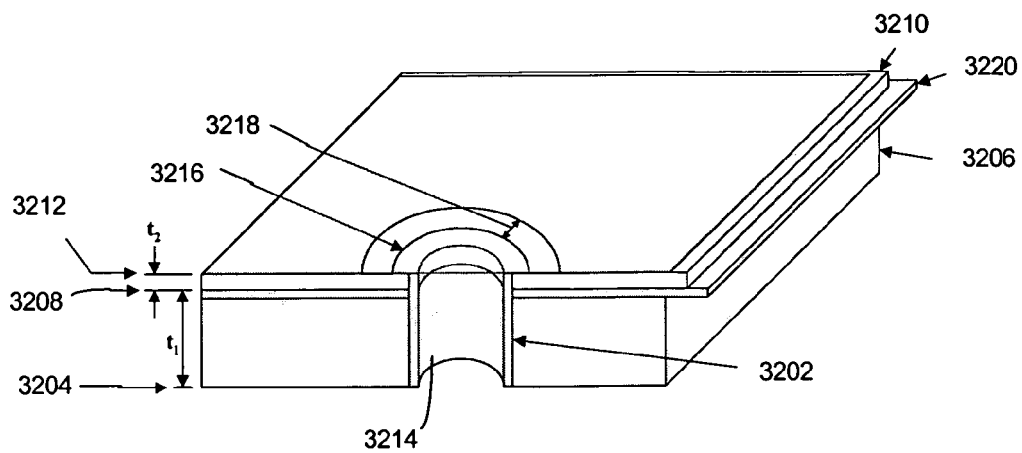
FIG. 32 illustrates a plated through hole suitable for use in an embodiment of a TEM mode suppression circuit.

FIG. 32 illustrates a printed circuit board (PCB) 3200 shown in partial cross section. The PCB 3200 has a plated through hole 3202 defined therein and is suitable for use in an embodiment of a TEM mode suppression circuit. The PCB 3200 structure includes a first metal layer 3204, a first dielectric core 3206, a second metal layer 3208, a second dielectric core 3210 and a third metal layer 3212. The plated through hole 3202 is lined with metal 3214. At the periphery of the plated through hole 3202, a via pad 3216 is formed to terminate the via on the top side of the PCB 3200. To avoid a short circuit, which is critical for power plane applications, a clearance space 3218 must be etched around the via pad 3216 on the third metal layer 3212. To maximize the capacitance $C_1$, this clearance space 3218 and the diameter of the via pad 3216 should be kept to a minimum.

While other embodiments are possible, it is generally preferred that $t_2$ should be as thin as possible to achieve the lowest $f_{lower}$. This implies that the patches on the second metal layer 3208 in FIG. 32 should be etched on the lower side of the second dielectric core 3210. To laminate the PCB structure, a prepreg layer 3220 may be used. In general prepreg layers permit a minimum distance between the patch layer and a plane having a different electric potential to be maintained (e.g. the patch layer may be grounded and the other plane at Vcc or vice-versa). The prepreg layer 3220 is positioned below the patches on the second metal layer 3208 as shown in the drawing. Hence the thickness of the lower dielectric layer, $t_1$, will be comprised of the sum of the thickness of the first dielectric core 3206 and the thickness of the prepreg layer 3220. The permittivity $\in_{r1}$ is calculated as the effective permittivity of both layers:

$$\varepsilon_{rl} = \frac{t_1}{t_{core1}/\varepsilon_{r,core1} + t_{prepreg}/\varepsilon_{r,prepreg}}. \qquad (23)$$

Another possible stackup (not shown) of the first embodiment, which preserves the blind vias, is to etch the patches on the top side of the first dielectric core 3206 and use one or more layers of prepreg to realize the second dielectric core 3210 of thickness $t_2$. In this alternative stackup, the prepreg material takes the place of the dielectric layer 112 in FIG. 2. This approach may have performance or manufacturing advantages.

The embodiments of TEM mode suppression circuits shown herein are not limited to realization in conventional printed circuit board technology. They may also be built into low temperature cofired ceramic (LTCC) modules. In fact, the period d can be dramatically reduced in LTCC for the same stopband frequency range due to the fact that permittivities of dielectric layers can be much higher in LTCC. Information on LTCC design guidelines for commercially available ceramic materials and processes can be found on numerous web sites including, for example, www.dupont.com/mcm and http://www.scrantom.com/Outgoing/designguide/seidg.pdf.

One example of a suitable LTCC material is Dupont 951 GreenTape™, available from E.I. duPont de Nemours Company, Wilmington, Del. Using conventional Dupont 951 GreenTape™ materials, assume the lower dielectric layer 110 in FIG. 2 is formed of a stack of four layers of Dupont 951AT ($\in_r$=7.8), each layer having a thickness of approximately 3.8 mils and chosen to accommodate a staggered (zigzag pattern) via of diameter as small as 4 mils. Hence $\in_{r1}$=7.8 and $t_1$=4(3.8)=15.2 mils. Further, assume solid patches are used on a square lattice of period d=60 mils with a gap of 15 mils between patches. The patches are 45 mils square, and the ratio of substrate area covered by metal is only 56%.

Figure 33:
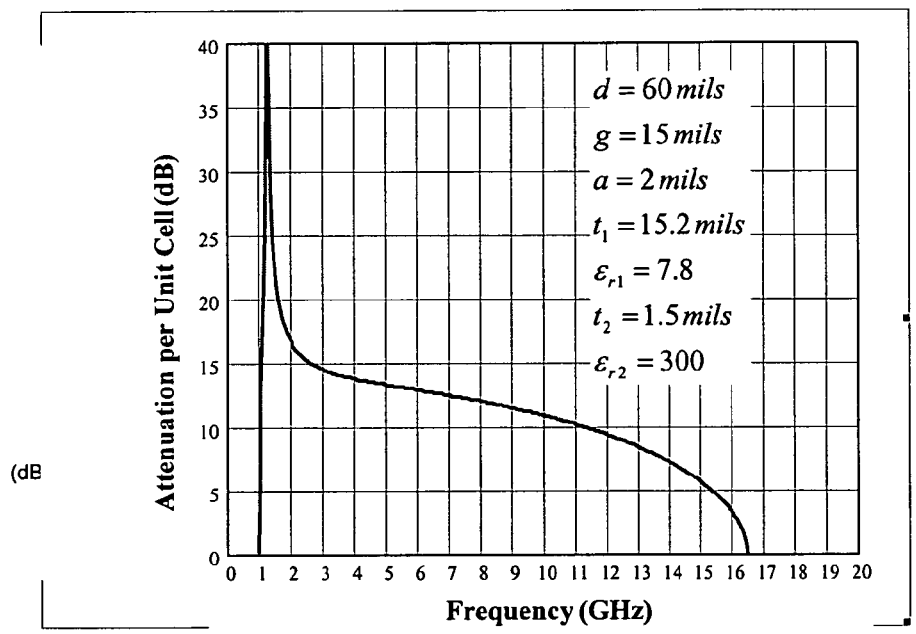
FIG. 33 shows attenuation per unit cell for a parallel plate waveguide in accordance with the embodiment of FIG. 2 in a low temperature co-fired ceramic module.

For the higher dielectric layer of thickness $t_2$, assume the use of Dupont XR7 high permittivity material with $\in_{r2}$=300, also available from E.I. duPont de Nemours Company. After firing, its typical thickness is $t_2$=1.5 mils. The predicted attenuation of this structure is shown in FIG. 33. A stopband ratio of 17:1 is predicted with the attenuation exceeding 10 dB per unit cell over 1 to 11 GHz. The analytic model developed above assumed a solid power or ground plane. In accordance with design guidelines, though, the power and ground planes must be meshed with 50% open area to permit proper bonding of ceramic layers. Therefore, in a practical design the capacitance $C_1$ will be a little less than predicted, and so will be the stopband ratio.

The embodiments described here are not limited in their realization with printed circuit boards and LTCC modules. Depending on the desired stopband frequency, TEM mode suppression circuits may be realized on-chip as part of a semiconductor wafer fabrication. One key to the design is to select materials and processes which surround the vias in a low permittivity material while placing a very high permittivity material between the patches and the nearest conductive plate of the PPW. In fact, the structure might even be fabricated upside down relative to what is shown in FIG. 2. Choices for the high permittivity dielectric include ceramic compounds such as $Zr_{0.15}Sn_{0.3}Ti_{0.55}O_2$ ($\in_{r2}$~60), or $PbZr_{0.53}Ti_{0.47}O_3$ ($\in_{r2}$~820), or $Ba_{0.15}Sr_{0.85}TiO_3$ ($\in_{r2}$~400). A good choice for a low permittivity material is $SiO_2$ ($\in_{r1}$~3.9). If the structure is implemented as a part of a semiconductor wafer, conventional materials used in semiconductor processing, such as doped and undoped silicon, silicon dioxide, silicon nitride doped and undoped polysilicon may be used. The various techniques known for modifying electrical parameters of portions of a semiconductor wafer may be used to tailor materials to particular design requirements.

Transmission line calculations for the first embodiment shown in FIG. 2 indicate that for a period of 100 μm, $t_1$=50 μm, $\in_{r1}$=3.9, $t_2$=0.25 μm, $\in_{r2}$=400, and an average via diameter of 40 μm, the fundamental stopband begins near 2.9 GHz and extends beyond 100 GHz, a stopband ratio greater than 30:1. Other choices of design parameters may prove to be more practical, but this example is meant to be illustrative of the possibilities.

Figure 34:
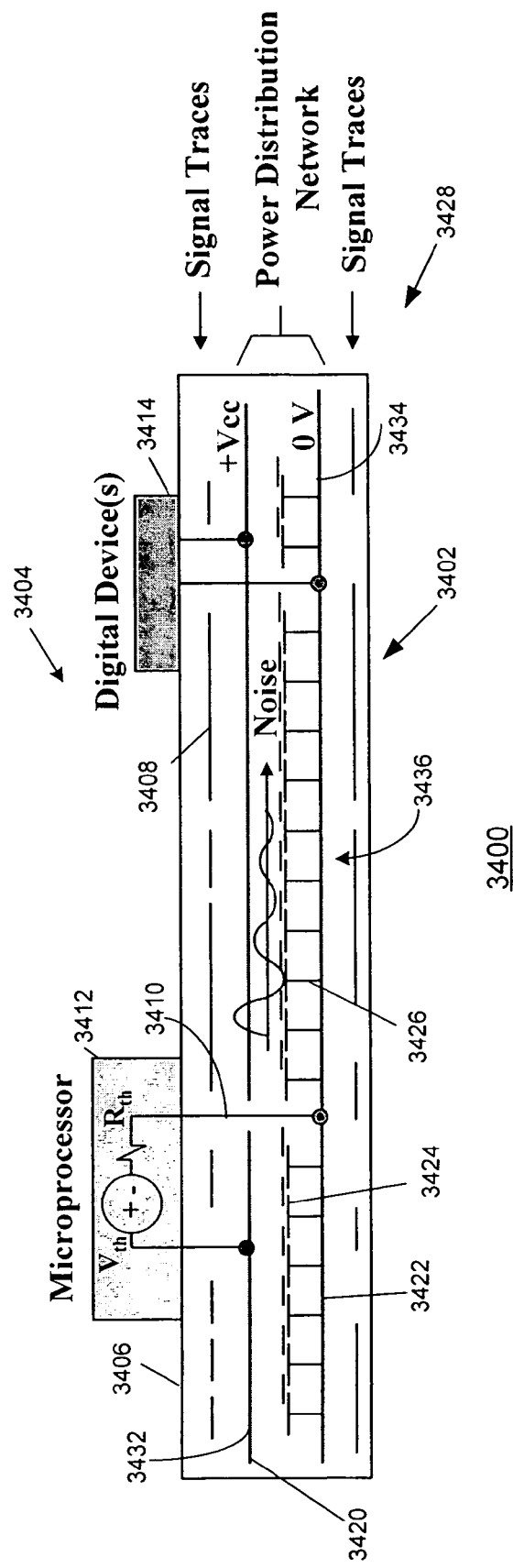
FIG. 34 is a cross section view of a printed circuit board incorporating a TEM mode suppression circuit.

FIG. 34 is a cross section view of a printed circuit board (PCB) 3400 incorporating a TEM mode suppression circuit 3402 in accordance with the embodiments disclosed herein. The PCB 3400 further includes electronic devices 3404 mounted on a surface 3406, signal traces 3408 and vias 3410 within the PCB.

The electronic devices 3404 may be any sort of device used in a circuit including passive devices such as resistors and capacitors and active devices such as semiconductors. In the illustrated example, the electronic devices 3404 include a microprocessor 3412 and an associated digital device 3414. In the illustrated embodiment, the electronic devices 3404 are surface mount devices or carriers which may be wave soldered or reflow soldered to metallized pads formed on the surface 3406 of the PCB 3400. In other embodiments, the electronic devices 3404 may include legs or posts which extend through plated through holes in the PCB 3400.

The signal traces 3408 and the vias 3410 route signal nodes and power and ground within the PCB. The signal traces 3108 lie in planes generally parallel to the surface 3406 of the PCB 3400. The vias 3410, in contrast, extend vertically, normal to the surface 3406. The vias 3410 may be plated through holes or may be blind vias which do not extend all the way through the PCB 3400.

The TEM suppression circuit 3402 may be configured in accordance with any of the embodiments described herein or extensions thereof. The TEM suppression circuit 3402 generally includes an upper conductive plate 3420, a lower conductive plate 3422, an array of coplanar conductive patches 3424 and an array of rods or vias 3126 extending between the lower conductive plate 3422 and respective patches 3424.

The TEM mode suppression circuit forms a power distribution network 3428 of the PCB 3400. The circuit formed on the PCB 3400 is powered by a positive voltage node 3432, indicated as +Vcc in FIG. 34. The circuit is grounded to a ground node 3434. The positive voltage node 3432 is formed by the upper conductive plate 3420 of the TEM mode suppression circuit 3402. Similarly, the ground node 3424 is formed by the lower conductive plate 3422 of the TEM mode suppression circuit 3402. Note that the power and ground planes may be reversed in the power distribution network without affecting the RF performance of the TEM mode suppression circuit.

In this manner, the TEM mode suppression circuit 3402 suppresses transverse electromagnetic modes in the space between the power plane 3420 and the ground plane 3422. Switching of the electronic devices 3404 such as the microprocessor 3412 introduces noise 3436 in the power distribution network 3428. The noise 3436 has a fundamental frequency and harmonics related to the switching frequencies of the microprocessor, the materials and geometries used in the design and other factors. Preferably, the features of the TEM mode suppression circuit 3402 are chosen as described herein to suppress or limit the noise 3436. More particularly, the fundamental stopband of the TEM mode suppression circuit 3402 should be designed to suppress propagation of the TEM modes at frequencies of interest, such as the switching frequencies of the electronic devices 3404. In this manner, noise introduced at a noise source in the power distribution network 3428 on either the positive voltage node 3432 or the ground node 3434 is significantly attenuated at other digital devices or other components of the PCB 3400.

Figure 35:
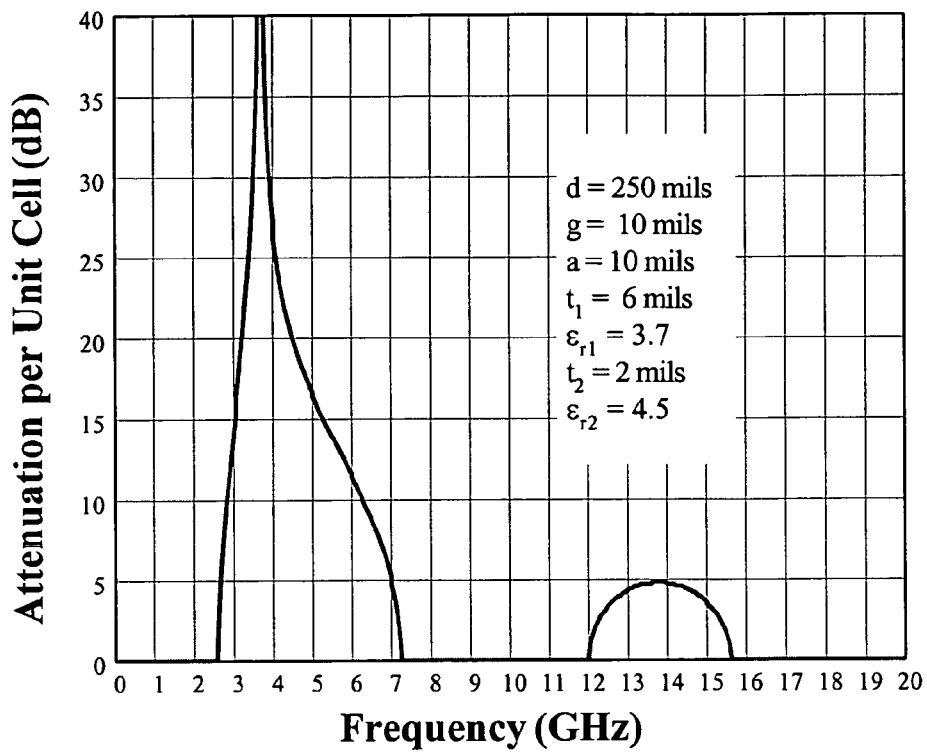
FIGS. 35–37 show attenuation per unit cell for low profile embodiments of a TEM mode suppression circuit based on the embodiment of FIG. 1.
Figure 36:
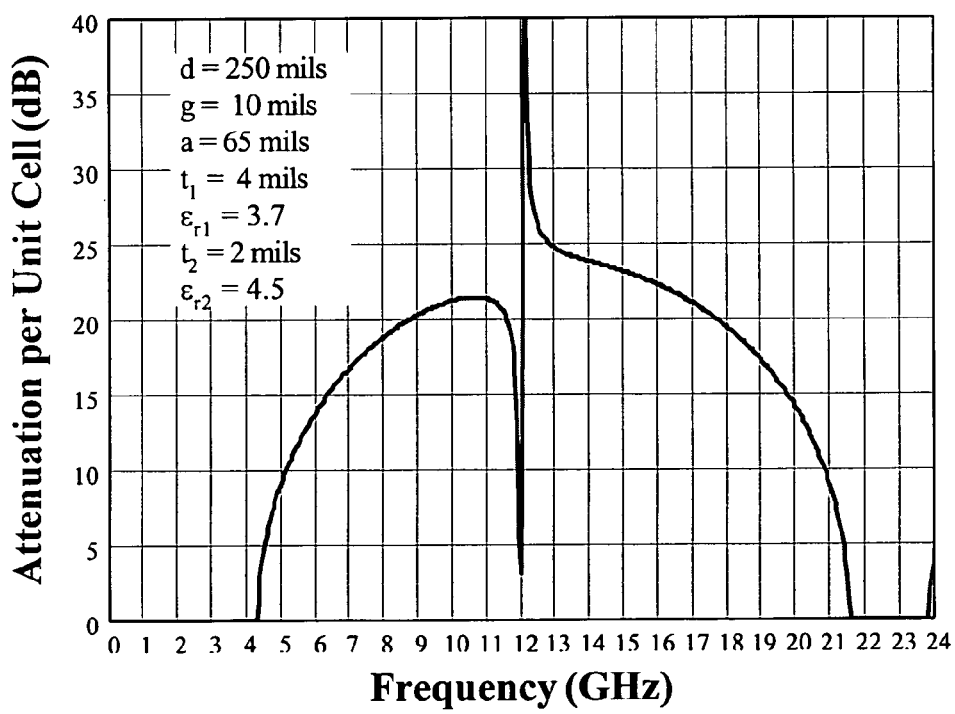
Figure 37:
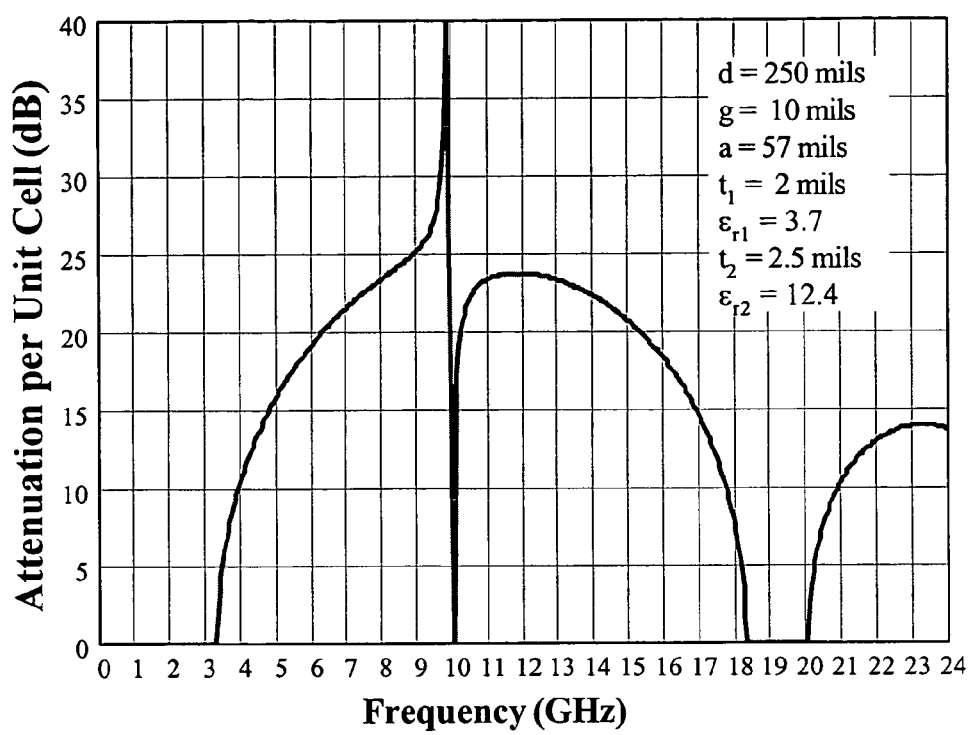

FIGS. 35–37 show attenuation per unit cell for low profile embodiments of a TEM mode suppression circuit based on the embodiment of FIG. 1. In many applications, it is desirable to reduce the vertical dimension of a printed circuit board (PCB). Current stack-up dimensions of state-of-the-art computer servers may contain five or more pairs of power/ground planes in one PCB. Power system designers attempt to place power and ground planes as close together as possible to obtain the lowest characteristic impedance possible for the power distribution system with typical separation distances of 10 mils or less. Spacing is as close as 2 mils in some cases. This low characteristic impedance minimizes the voltage fluctuations present on a power distribution network (PDN) when transients of supply current are present.

FIGS. 35–37 show simulated attenuation per unit cell for TEM mode suppression circuits for three different spacings of power and ground planes. Simulations were performed using the equivalent model developed above for the embodiment of a TEM mode suppression circuit of FIG. 1. Similar to the PCB embodiment of FIG. 34, the upper conductive plate of the TEM mode suppression circuit serves electrically as the positive reference voltage node and the lower conductive plate serves electrically as the ground node.

In the example of FIG. 35, the power to ground spacing is 8 mils. In this example, the via diameter is reduced to 20 mils to allow the lower edge of the fundamental stopband, $f_{lower}$, to be less than 3 GHz using conventional FR4 materials. The lower dielectric layer is a 6 mils thickness of Park Nelco 4000-13 epoxy laminate, available from Nelco North America, Fullerton, Calif. The upper dielectric layer is a buried capacitance layer known as ZBC 2000TM available from Merix Corp., Forest Grove, Oreg. In this example, the period d of the vias in a square lattice is 250 mils. The gap g between patches is 10 mils. The patches are square and measure 240 mils on a side (s=240 mil). The thickness $t_1$ of the substrate layer is 6 mils. This also corresponds to the via length. The thickness $t_2$ of the superstrate layer above the patches is 2 mils. The relative permittivity of the substrate dielectric, $\varepsilon_{r1}$ is 3.7 and the relative permittivity of the superstrate dielectric $\varepsilon_{r2}$ is 4.5.

The attenuation plot of FIG. 35 shows that this example has $f_{lower}$ of 2.6 GHz and $f_{upper}$ of 7.222 GHz, giving a stopband ratio of 2.778. This is comparable to a prior art electromagnetic band gap structure which is 131 mils (3.3 mm) thick and employs PTFE as one of the dielectric layers. In contrast, similar performance is provided in this example using FR4 material where the total height is only 8 mils thick. FR4 materials are generally much less expensive than PTFE. Thus, the overall thickness of the structure is reduced by a factor of 16. The benefits are achieved in part by decreasing the thickness and thereby increasing the capacitance $C_1$ between the patches and the upper conductive plate of the PPW.

In the example of FIG. 36, the thickness $t_1$ of the substrate layer is reduced to 4 mils, but the via diameter is increased to 130 mils to force the $L_1C_1$ resonance to occur at a frequency which would normally fall between the two lowest stopbands. On the omega-beta diagram of FIG. 5, this frequency is near the intersection of the light line and the Brillouin zone boundary. This yields the following approximate constraint on the $L_1C_1$ product:

$$\omega_{zero} = \frac{1}{\sqrt{L_1 C_1}} = \frac{\pi c}{d\sqrt{\varepsilon_{\mathit{eff}}}} \qquad (24)$$

Enforcing equation (24) has moved the transmission zero to near 12 GHz, enabling the fundamental and secondary stopbands to merge. This results in a much larger stopband of 4.5 GHz to 21.5 GHz, a stopband ratio of about 4.75:1. This is remarkable given that the thickness of the entire structure is only 6 mils plus metal thickness. The lower dielectric layer is 4 mils of Park Nelco 4000-13, and the upper dielectric layer is 2 mils of a buried capacitance layer known as ZBC 2000TM available from Merix Corp.

In this example, the period d of the vias in a square lattice is 250 mils. The gap g between patches is 10 mils. The patches are square and measure 240 mils on a side (s=240 mil). The thickness $t_1$ of the substrate layer is 4 mils. This also corresponds to the via length. The thickness $t_2$ of the superstrate layer above the patches is 2 mils. The relative permittivity of the substrate dielectric, $\varepsilon_{r1}$ is 3.7 and the relative permittivity of the superstrate dielectric $\varepsilon_{r2}$ is 4.5.

In the example of FIG. 37, the PCB stackup has an even lower profile. This design employs a 4.5 mil total stackup between power and ground metal and uses a non-FR4 dielectric material. The upper, high dielectric layer is realized with a new titanate-filled, hydrocarbon resin-based substrate as described in U.S. Pat. No. 5,571,609 by St. Lawrence, et al., and available from Rogers Corporation, Rogers, Conn. The ratio of dielectric constant ($\varepsilon_r$=12.4) to thickness is higher than many other choices of rigid PCB materials.

In this example, the via diameter is again chosen to force the $L_1C_1$ resonance to occur at a frequency which would normally fall between the two stopbands. In this case, the via diameter is about 114 mils. This has created a much larger stopband of 3.3 GHz to 18.2 GHz. The lower dielectric layer is 2 mils of Park Nelco 4000-13, and the upper dielectric layer is the substrate material described above and available from Rogers Corporation. Also in this example, the period d of the vias in a square lattice is 250 mils. The gap g between patches is 10 mils. The patches are square and measure 240 mils on a side (s=240 mil). The thickness $t_1$ of the substrate layer is 2 mils. This also corresponds to the via length. The thickness $t_2$ of the superstrate layer above the patches is 2.5 mils. The relative permittivity of the substrate dielectric, $\varepsilon_{r1}$, is 3.3 and the relative permittivity of the superstrate dielectric $\varepsilon_{r2}$, is 12.4.

The periodic TEM mode suppression circuits described so far are homogeneous, meaning that the properties of the unit cell do not change with location. However, it may be desirable in certain designs to create inhomogeneous mode suppression structures where the band edges do vary in frequency as a function of lateral position within the PCB. For instance, the patch sizes or via diameters or both may be graded or graduated with lateral position to create broader frequency stopbands between two different reference plane locations on the same PCB.

The TEM mode suppression circuits described herein are not limited to planar structures. Parallel-plate waveguides can also be curved in cross section. In the limit, a waveguide cross section that is curved and closes upon itself becomes a coaxial waveguide. Square coaxial waveguides are another embodiment.

Figure 38:
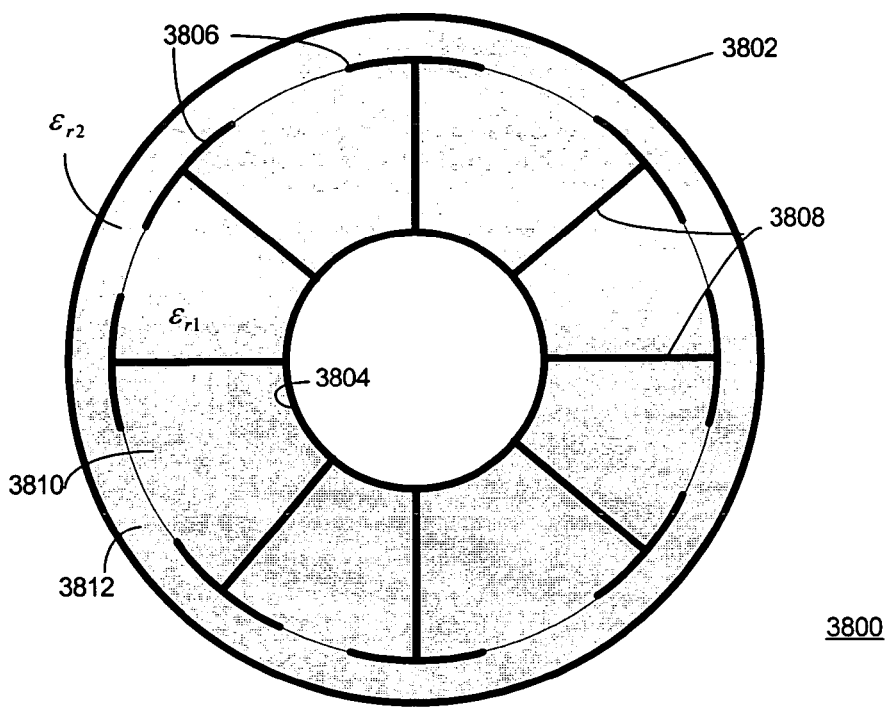
FIG. 38 shows a coaxial waveguide with a TEM mode suppression circuit located between inner and outer conductors.

Thus, FIG. 38 shows a coaxial waveguide 3800 with a TEM mode suppression circuit located between inner and outer conductors. The coaxial waveguide 3800 includes an outer conductor 3802, an inner conductor 3804, an array of patches 3806 and vias 3808. A first dielectric layer 3810 having relative permittivity $\in_{r1}$ separates the inner conductor 3804 and the patches 3806 and contains the vias 3808. The vias 3808 extend between the inner conductor 3804 and respective patches 3806. A second dielectric layer 3812 having relative permittivity $\in_{r2}$ separates the patches 3806 and the outer conductor 3802.

Figure 39:
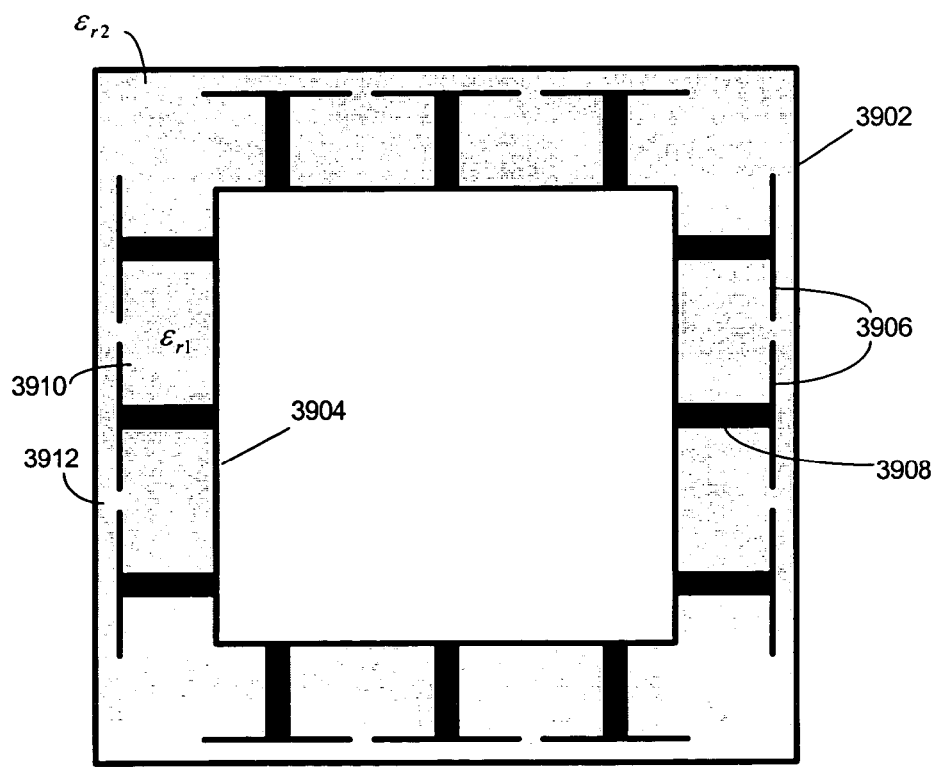
FIG. 39 shows a square coaxial waveguide with a TEM mode suppression circuit located between the inner and outer conductors.

Similarly, FIG. 39 shows a square coaxial waveguide with a TEM mode suppression circuit located between the inner and outer conductors. The square coaxial waveguide 3900 includes an outer conductor 3902, an inner conductor 3904, an array of patches 3906 and vias 3908 extending between the inner conductor 3904 and respective patches. A first dielectric layer 3910 has relative permittivity $\in_{r1}$ and separates the inner conductor 3904 from the patches 3906 and contains the vias 3908. A second dielectric layer 3912 having relative permittivity $\in_{r2}$ separates the patches 3906 and the outer conductor 3902.

The patches 3806, 3906 of the waveguides 3800, 3900 may have any surface shape, similar to the shapes described above in connection with FIGS. 12 and 14. Also, the patch dimensions may be nonuniform, as in the embodiments of FIGS. 21 and 28. Still further, the dimensions of the vias 3808, 3908 may also be nonuniform, similar to the embodiment of FIG. 25. Still further, these variations can be combined together in a coaxial or square coaxial waveguide to provide additional flexibility. Other coaxial embodiments (not shown) include vias connected to the outer conductor and connected to patches located substantially closer to the inner conductor.

The patches are preferably arranged as an array of circumferential patches. Respective patches are spaced from adjacent patches by circumferential gaps. The circumference of the coaxial waveguide may be proportioned between the patches and gaps in any suitable manner. Also, the length of the patches along the axis of the coaxial waveguide may be any suitable dimension. The vias are positioned in the first dielectric material. Respective vias electrically connect respective circumferential patches with the inner conductor.

Unfortunately, if standard 2-mil FR4 prepreg layers are used to form the overall structures, the use of thin rigid dielectric materials for this layer leads to thicker structures since the prepreg still must be used in the lamination process to put the various dielectric layers together. For example, if a 2-mil dielectric material is used, then the superstrate layer thickness will be 4 mils since a 2-mil prepreg layer must be used to laminate the superstrate and substrate layers together. The thicker superstrate leads to less capacitance, which in turn leads to higher stopband frequencies and less bandwidth.

As is evident, to alter the stopband frequencies it may be desirable to increase the capacitance and/or decrease the inductance of the structure. Comparing two vias with the same overall length, but different diameters, the larger diameter via will have less inductance than the smaller diameter via, which once again leads to a greater stopband bandwidth. Printed circuit board (PCB) manufactures typically use via diameters of as small as 10 or 11 mils (and more typically 18 mils or even 25 mils) for connecting signal traces to various locations on the board. Via diameters larger than 40 mils, which may be used to obtain an equivalent circuit with the desired inductance and are shown in some of the embodiments above, are uncommon in most PCBs.

However, manufacturing problems may exist in fabricating structures containing such large vias. Non-standard equipment may be required to achieve vias with diameters larger than 25 mils. In addition, buried vias having diameters that are overly large can result in problems for noise suppression circuits that use prepreg layers adjacent to the patches. If a large diameter via (e.g. greater than 100 mils) is used to minimize the inductance, then during the lamination process the viscid prepreg flows into the large diameter via holes. This depletes the amount of dielectric material between the patches and adjacent plane that forms the capacitance. The depletion of an already paper-thin dielectric layer may result in an electrical short circuit between this plane (which may be the power plane) and the patches, which in turn are connected to the ground plane through the vias. Thus, for patches with large diameter vias the power and ground planes may be shorted together and may therefore be unusable.

Creation of structures possessing vias with physically smaller diameters that have the same electrical effect of vias with physically large diameters is desirable in this case. One manner of accomplishing this is by using a number of vias with smaller diameters rather than using a single large diameter via. This is analogous to connecting inductors in parallel between two nodes of a circuit, which reduces the equivalent inductance. In this case, the total inductance can be calculated essentially as $L_T=\sqrt{(L_1 \cdot L_2 \cdot ...)/(L_1+L_2+...)}$, where $L_T$ is the total inductance and $L_i$ are the inductances of the individual vias in a particular patch, neglecting self-inductance effects between the vias.

Figure 40:
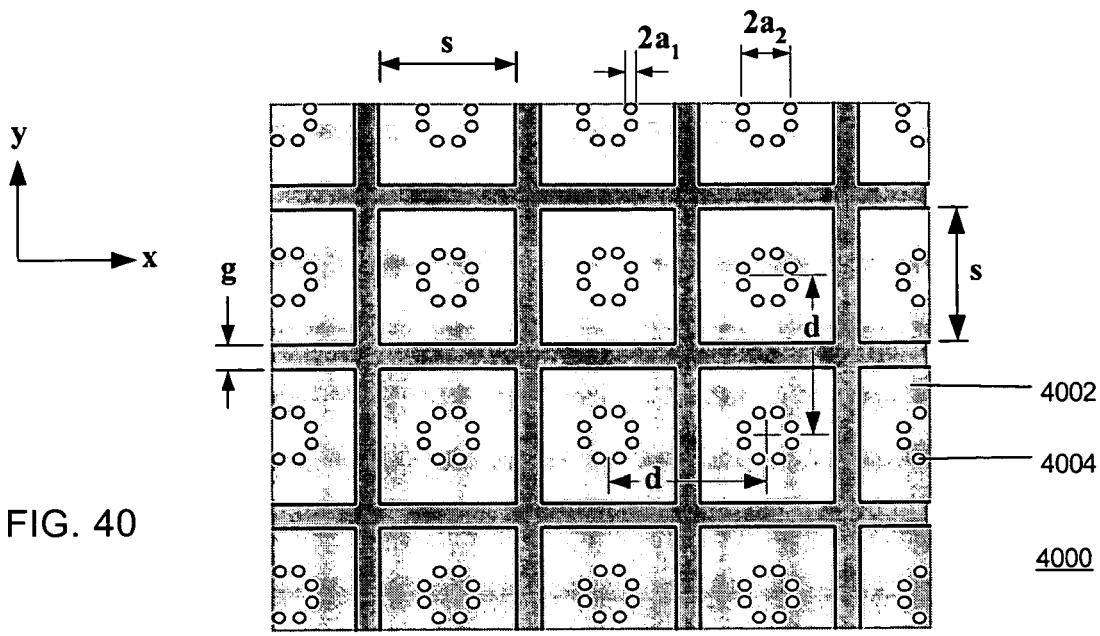
FIG. 40 shows a plan view of an embodiment with patches having multiple vias arranged in a circle.

FIG. 40 illustrates one such example of using multiple vias. In this figure, the TEM mode suppression circuit 4000 includes patches 4002 and vias 4004. The vias have small diameters (less than about 25 mils, small enough such that the prepreg fill effects are negligible) and are arranged in a circle to approximate a large diameter via. The parallel current paths that are provided by the array of vias within each patch cause the structure to behave electrically as if there is one large via in the patch. In each of FIGS. 40–44, as above: the patches are substantially square and have a side dimension s, the patches are separated by a distance g, the total distance of the unit cell is d (which includes both the side dimension s of the patch and the separation, g, between patches) and the individual vias have a circular cross-section with a diameter $2a_1$. The distance between vias may depend on the tolerance of the tool used to fabricate the vias, typically 4–5 mils to a mechanical drill and less if a laser is used. In FIG. 40, the diameter from the center of one of the vias to a center of a via on the opposite side (i.e. the diameter of the approximate large diameter via formed by the circle of smaller vias) is $2a_2$. Note that although none of the cross-sectional views of the embodiments of FIGS. 40–44 are illustrated, they are similar to the cross-sectional views of the embodiments shown previously.

The PPW 4000 also includes a top conductive layer and a top dielectric layer isolating the patches 4002 from the top conductive layer in a manner similar to previous structures. A lower dielectric layer contains the vias 4002 and isolates the patches from a lower conductive layer. The top and lower conductive layers and top and lower dielectric layers are not shown in the plan view of FIG. 40.

Figure 41:
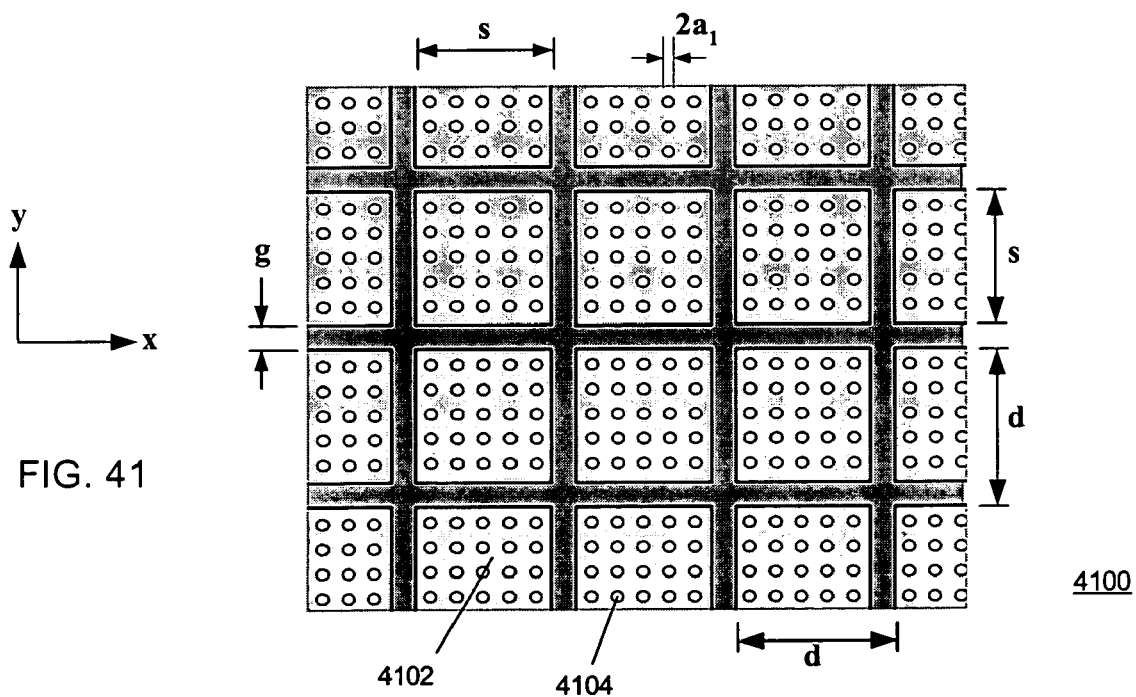
FIG. 41 shows a plan view of an embodiment with patches having multiple vias arranged in an array.

However, the arrangement of FIG. 40 is not the only manner to arrange the small diameter vias. There are various ways of orienting multiple vias within each patch to obtain an equivalent electrical effect. The vias need not be arranged in a circle as any addition of multiple vias will decrease inductance compared to one via in a patch. FIG. 41 shows a TEM mode suppression circuit 4100 in which a series of vias 4104 are oriented in a grid pattern within each patch 4102. In FIG. 41, the vias have small diameters and are periodically or nearly periodically arranged.

Figure 42:
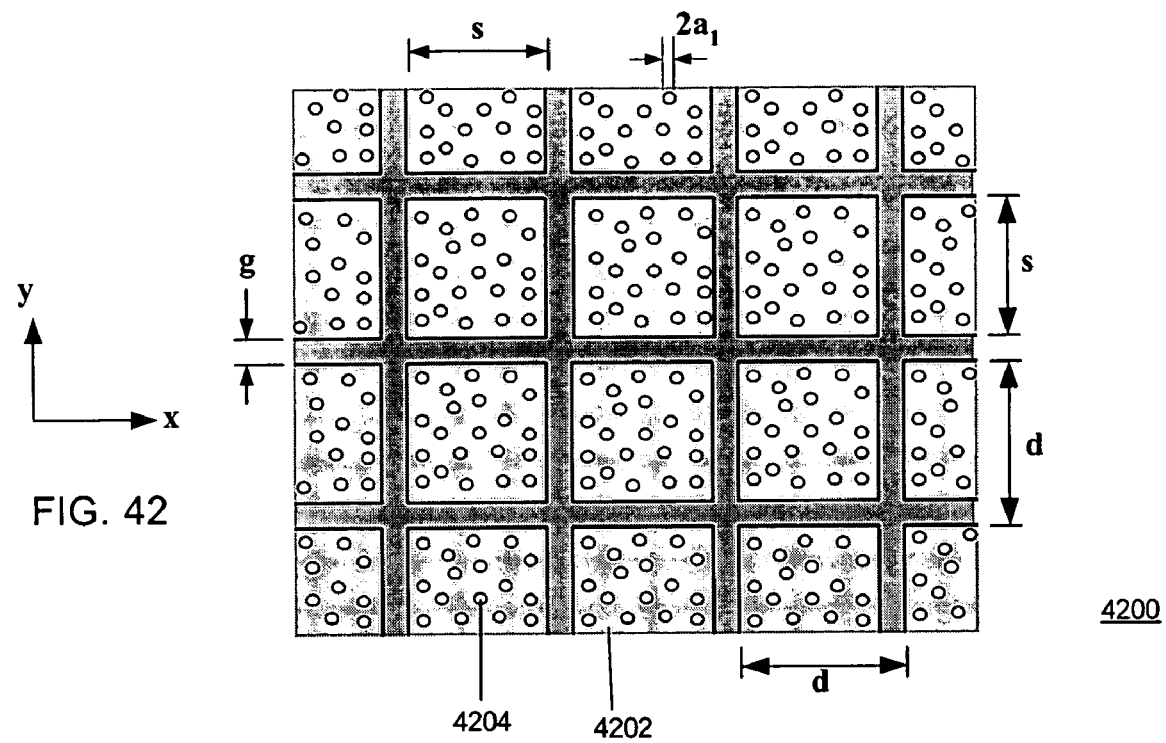
FIG. 42 shows a plan view of an embodiment with patches having multiple vias randomly distributed.

Another arrangement is shown in FIG. 42. In this figure, a TEM mode suppression circuit 4200 in which a series of vias 4204 are randomly oriented within each patch 4202. Although the vias 4204 shown in FIG. 42 are randomly distributed within each patch 4202 but the distributions are duplicated from patch to patch, both the number and distribution of the vias 4204 may be different from patch to patch. Vias having random patterns may provide more degrees of freedom of design and thus may be used to accommodate other requirements of the particular board manufactured.

Figure 43:
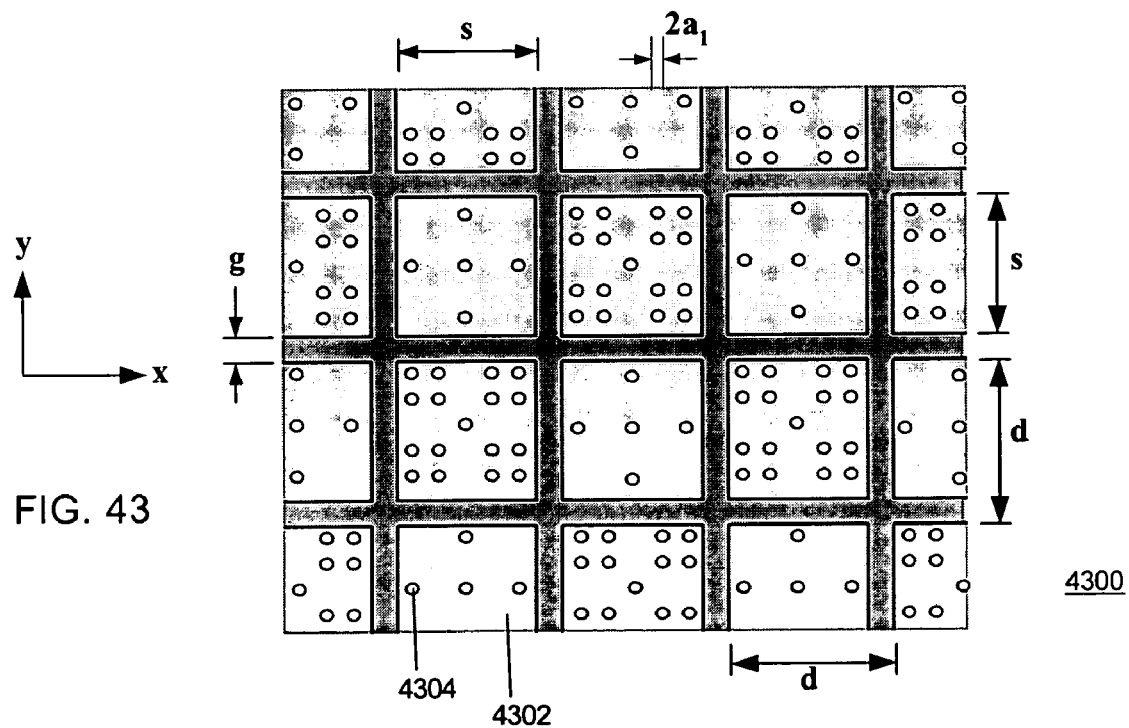
FIG. 43 shows a plan view of an embodiment with patches having multiple vias arranged in a checkerboard array.

Other advantages may exist in using different numbers, distributions and/or sizes of multiple vias in one patch compared to adjacent patches (although it may be preferable to provide vias of the same diameter for manufacturing ease). Similar to the arrangement in FIGS. 25–27, such a structure may be used to create multiple stopbands and broadband stopbands. One embodiment in which the number and arrangement of adjacent vias is different is shown in FIG. 43. The TEM mode suppression circuit 4300 in this figure contains patches 4302 in which the vias 4304 within each patch 4302 are arranged in a predetermined pattern, with diagonally adjacent patterns being the same and horizontally and vertically adjacent patterns being different. In other words, similar to the embodiment shown in FIG. 25, the patches 4302 are arranged in a checkerboard arrangement in which the inductance of diagonally adjacent patterns are the same and the inductance of horizontally and vertically adjacent patterns are different. The number, distribution, and/or diameter of the vias in the patches may be varied dependent on the desired inductance.

In FIGS. 40–44, although the shapes of the patches are shown as square, other shapes may be possible. Shapes similar to those shown in FIG. 12, 14, 16, or 21 may be used (as well as other shapes not shown). In addition, similar to FIG. 19, multiple overlapping layers may be used with the arrangements of FIGS. 40–44. Essentially, any combination of patch arrangement and shape and via size/number/distribution may possibly be used if the combination of inductance and capacitance provides the desired stopband(s) to be achieved, along with avoiding any manufacturing problems.

Figure 44:
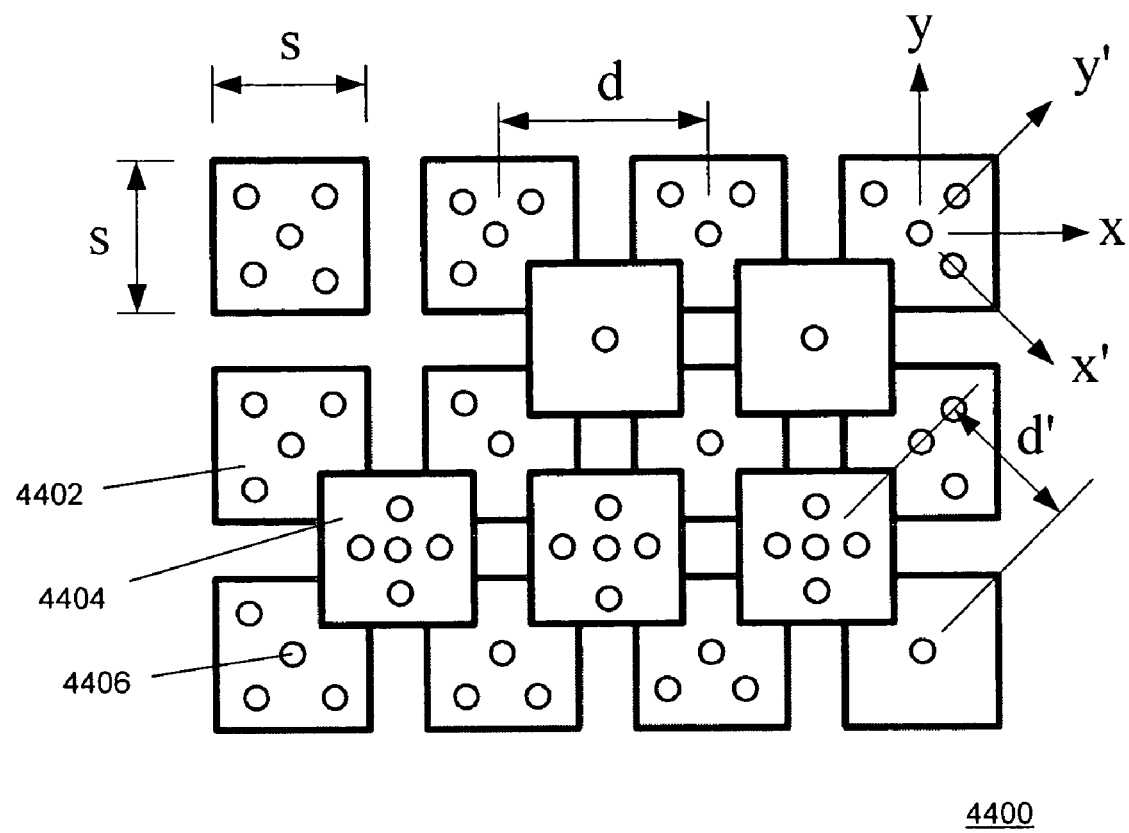
FIG. 44 shows a plan view of an embodiment with multiple layers of patches, at least some of which have multiple vias.

For example, FIG. 44 illustrates an embodiment similar to that of FIG. 19. FIG. 44 is another embodiment of a TEM mode suppression circuit 4400 containing two levels of capacitive patches, including patches 4402 on a first layer and patches 4404 on a second layer. This exemplary embodiment uses a square lattice of square patches 4402, 4404 for each level with period d. The patches are identical in size for each layer. Each patch 4402, 4404 has an associated via 4406. However, as in the embodiment of FIG. 19, in the embodiment of FIG. 44, the principal axes are the x' and y' axes, and the via period is reduced to $d'=d/\sqrt{2}$. As above, the number and distribution of vias on the patches may be identical or different, dependent on the desired characteristics. As previously described, any other design permutations are possible based on the embodiments disclosed herein. For instance, the patches of a dual-layer design, can have any polygonal shape, such as triangular, hexagonal, trapezoid, or other, or even a circular shape.

From the foregoing, it can be seen that the present embodiments provide improved circuits, devices and methods for reducing induced power plane noise and improving RF isolation. The devices may be embodied as periodic structures within waveguides capable of supporting TEM mode propagation, or as transverse electromagnetic mode suppression circuits. These embodiments have several distinct advantages over conventional EMI or EMC solutions.

First, the PCB embodiments eliminate many of the higher frequency surface-mounted bypass capacitors and hence reduce bill of materials costs for completed assemblies. Also, PCB assembly costs for attaching those capacitors are reduced. Elimination of surface mounted capacitors also frees up PCB real estate. For instance if 100 capacitors of average area of 4 mm$^2$ each are eliminated, then 400 mm$^2$ of board area is saved. This can be critical in high density PCBs.

Second, the embodiments offer significantly more RF isolation than is attainable from bypass capacitors alone. Isolation levels of 100 dB or more are practical between points on a power plane separated by only 2 inches (10 unit cells times 10 dB per unit cell for a period of 0.2 inches). The disclosed embodiments will cut off parallel plate modes that travel in any transverse direction, assuming the power plane is large enough in transverse dimensions to accommodate enough cell periods to achieve the desired attenuation.

Third, the embodiments are effective as very broadband microwave bandstop filters. The fundamental stopband of the simplest embodiment, FIGS. 1 and 2, can have a bandwidth ratio of 6.6:1 or more for PCB technology less than 1 mm in thickness. FIG. 6 provides an example. This stopband ratio is significantly more broadband than any electromagnetic bandgap (EBG) structure for parallel plate waveguides published to date.

Fourth, these embodiments can readily be designed to have a transmission zero ($L_1C_1$ resonance) as low as 500 MHz using conventional PCB materials (2 mil FR4 core) and processes. This zero frequency is three to four times lower in frequency than published data using conventional high-impedance surfaces embedded into parallel plate waveguides.

Fifth, these embodiments may be lower in PCB fabrication cost than conventional high-impedance surfaces for several reasons. First, fewer layers of metal are required in the PCB design for the single layer patch embodiments. Second, much thinner dielectric layers can be used. For instance, a conventional high-impedance surface of the type shown in example (a) of FIG. 3 will need two additional metal layers for the frequency selective surface, assuming it uses a two-layer FSS to achieve a stopband as low as 2 GHz. Also, the high-impedance surface design of example (c) of FIG. 3 uses two extra metal layers, one for the capacitive FSS, and a second for the buried loop. In contrast, this invention could be fabricated with only one extra metal layer, the layer needed for the buried capacitive patches.

Sixth, these embodiments of TEM mode suppression circuits represent a significant reduction in overall thickness over the prior art EBG structures. The thinnest prior art structure has a total thickness of 3.3 mm, or 130 mils, and a fundamental stopband of 3.2 GHz to 4.9 GHz. In contrast, the example of FIG. 35 is only 8 mils thick and exhibits a wider stopband from 2.6 GHz to 7.2 GHz. This is a 16× reduction in thickness. Reduced thickness dielectric layers also means a dramatic reduction in weight or mass of the PCB.

It is therefore intended that the foregoing detailed description be regarded as illustrative rather than limiting, and that it be understood that it is the following claims, including all equivalents, that are intended to define the spirit and scope of this invention.

We claim:

1. An apparatus for suppressing noise in an electrical device, the apparatus comprising:
 an upper conductive plate;
 an array of conductive coplanar patches a distance $t_2$ from the upper conductive plate, the distance $t_2$ chosen to optimize capacitance between the conductive coplanar patches and the upper conductive plate for suppression of noise;
 a lower conductive plate a distance $t_1$ from the array of conductive coplanar patches; and
 conductive rods extending from respective patches to the lower conductive plate.

2. The apparatus of claim 1 wherein the conductive rods comprise conducting vias in a printed circuit board structure.

3. The apparatus of claim 1 wherein the sum of distance $t_1$ and the distance $t_2$ is less than 1 mm.

4. The apparatus of claim 1 further comprising a lower dielectric layer having a relative dielectric constant $\in_{r1}$ and an upper dielectric layer having a relative dielectric constant $\in_{r2}$.

5. The apparatus of claim 4 wherein $\in_{r1}$ and $\in_{r2}$ are chosen such that $\in_{r2} \geq \in_{r1}$.

6. The apparatus of claim 4 wherein the lower dielectric layer and the upper dielectric layer are configured such that the dielectric layer having the highest relative dielectric constant is the thinnest dielectric layer.

7. The apparatus of claim 4 wherein the lower dielectric layer has thickness substantially equal to $t_1$ and the upper dielectric layer has thickness substantially equal to $t_2$, the thicknesses being chosen so that $t_2 << t_1$.

8. The apparatus of claim 4 wherein the thickness $t_2$ is of the upper dielectric layer between the patches and the upper conductive plate and is no more than 50% of the height of the apparatus.

9. The apparatus of claim 1 wherein the apparatus is fabricated using low temperature co-fired ceramic technology.

10. The apparatus of claim 1 wherein the apparatus is fabricated on a semiconductor wafer.

11. The apparatus of claim 1 wherein each patch of the array of conductive coplanar patches has a shape selected from the group consisting of circular, square, triangular, rectangular and hexagonal.

12. The apparatus of claim 1 further comprising:
 a second array of conductive planar patches positioned a distance from the lower conductive plate; and
 second conductive rods extending from respective patches of the second array to the upper conductive plate.

13. The apparatus of claim 1 wherein the patches are uniform in size.

14. The apparatus of claim 1 wherein the patches are non-uniform in size.

15. The apparatus of claim 1 wherein a dispersion diagram for a unit cell of the apparatus is characterized by more than one transmission zero.

16. The apparatus of claim 1 wherein at least one transmission zero is adjustable to effectively merge fundamental and secondary stopbands.

17. The apparatus of claim 1 wherein the patches are non-uniform in type.

18. The apparatus of claim 17 wherein the non-uniform patches include at least some hexagonal patches and at least some triangular patches.

19. The apparatus of claim 1 wherein the conductive rods are non-uniform in diameter.

20. The apparatus of claim 1 wherein inductive traces are arranged in series between the conductive rods and the coplanar patches.

21. The apparatus of claim 1 wherein the patches have one of a first size and a second size.

22. The apparatus of claim 1 wherein the patches are spaced a uniform gap distance from surrounding patches.

23. The apparatus of claim 1 wherein at least one of the patches and the lower conductive plate are connected by multiple conductive rods.

24. The apparatus of claim 23 wherein the multiple conductive rods connecting one or more of the patches with the lower conductive plate are arranged in a circle.

25. The apparatus of claim 23 wherein the multiple conductive rods connecting one or more of the patches with the lower conductive plate are arranged in an array.

26. The apparatus of claim 23 wherein the multiple conductive rods connecting one or more of the patches with the lower conductive plate are randomly distributed.

27. The apparatus of claim 23 wherein adjacent patches are connected with the lower conductive plate by the same number and distribution of the multiple conductive rods.

28. The apparatus of claim 23 wherein adjacent patches are connected with the lower conductive plate by at least one of a different number or a different distribution of the conductive rods.

29. The apparatus of claim 28 wherein the patches are arranged such that at least one of the number of conductive rods and distribution of the conductive rods in patches adjacent to each other in orthogonal directions are different and patches adjacent to each other in directions between the orthogonal directions are the same.

30. A parallel plate waveguide comprising:
 an upper conductive plate; a lower conductive plate separated by a distance substantially less than 1 mm from the upper plate;
 an array of conductive patches positioned on a plane which is spaced a first distance from the lower conductive plate by a first dielectric layer and spaced a second distance from the upper conductive plate by a second dielectric layer to create one or more stopbands of frequencies over which transverse electromagnetic (TEM) modes are suppressed when energy is applied to the parallel plate waveguide.

31. The parallel plate waveguide of claim 30 wherein the one or more stopbands include a fundamental stopband as the lowest frequency stopband.

32. The parallel plate waveguide of claim 30 wherein the fundamental stopband is defined by an upper frequency and a lower frequency and wherein a ratio of the upper frequency to the lower frequency exceeds 4:1.

33. A parallel plate waveguide (PPW) configured to suppress noise at one or more stopbands of frequencies, the PPW comprising:
   first and second substantially parallel conductive plates;
   an plural of rods contained in a first dielectric layer and positioned substantially normal to the plates, the rods having a length which spans at least 80% of the height between the plates, one end of each rod terminating at a first plate and another end of the each rod terminating on a conductive patch positioned substantially parallel to the plates, the length of the rods chosen to define the one or more stopbands at frequencies of interest.

34. The PPW of claim 33 further comprising a second dielectric layer between the patch and a second plate.

35. The PPW of claim 34 wherein the relative dielectric constant of the second dielectric layer is much greater than the relative dielectric constant of the first dielectric layer.

36. The PPW of claim 34 wherein the thickness of the first dielectric layer is much greater than the thickness of the second dielectric layer.

37. The PPW of claim 33 wherein in the patch is one patch of an array of patches, each patch having a shape which is one of circular and polygonal.

38. The PPW of claim 33 wherein at least one of the patches is connected to the first plate by multiple conductive rods.

39. The PPW of claim 38 wherein the multiple conductive rods connecting one or more of the patches with the first plate are arranged in a circle or an array.

40. The PPW of claim 38 wherein the multiple conductive rods connecting one or more of the patches with the first plate are randomly distributed.

41. The PPW of claim 38 wherein adjacent patches are connected with the first plate by the same number and distribution of the multiple conductive rods.

42. The PPW of claim 38 wherein adjacent patches are connected with the first plate by at least one of a different number or a different distribution of the conductive rods.

43. The PPW of claim 42 wherein the patches are arranged such that at least one of the number of conductive rods and distribution of the conductive rods connected to patches adjacent to each other in orthogonal directions are different and patches adjacent to each other in directions between the orthogonal directions are the same.

44. Apparatus for suppressing noise in an electrical device, the apparatus comprising:
   an upper conductive plate;
   an array of conductive coplanar patches;
   a lower conductive plate separated from the array of conductive coplanar patches by a dielectric layer; and
   conductive rods connecting patches to the lower conductive plate, at least one of the patches connected to the lower conductive plate by multiple conductive rods.

45. The apparatus of claim 44 wherein the conductive rods comprise plated through vias in a printed circuit board structure.

46. The apparatus of claim 44 wherein each patch of the array of conductive coplanar patches has a shape selected from the group consisting of circular, square, triangular, rectangular and hexagonal.

47. The apparatus of claim 44 further comprising a second array of conductive planar patches separated from the lower conductive plate and from the first array of conductive planar patches.

48. The apparatus of claim 47 further comprising:
   an upper conductive plate separated from the lower conductive plate and from the first array of conductive planar patches; and
   second conductive rods extending from patches of the second array to the upper conductive plate.

49. The apparatus of claim 44 wherein the patches are uniform in size.

50. The apparatus of claim 44 wherein the patches are non-uniform in size.

51. The apparatus of claim 44 wherein the patches are non-uniform in type.

52. The apparatus of claim 44 wherein the conductive rods are non-uniform in diameter.

53. The apparatus of claim 44 wherein inductive traces are arranged in series between the conductive rods and the coplanar patches.

54. The apparatus of claim 44 wherein the patches are spaced a uniform gap distance from surrounding patches.

55. The apparatus of claim 44 wherein each of the patches and the lower conductive plate are connected by multiple conductive rods.

56. The apparatus of claim 44 wherein the multiple conductive rods connecting one or more of the patches with the lower conductive plate are arranged in one of a circle or an array.

57. The apparatus of claim 44 wherein the multiple conductive rods connecting one or more of the patches with the lower conductive plate are randomly distributed.

58. The apparatus of claim 44 wherein adjacent patches are connected with the lower conductive plate by the same number and distribution of the multiple conductive rods.

59. The apparatus of claim 44 wherein adjacent patches are connected with the lower conductive plate by at least one of a different number or a different distribution of the conductive rods.

60. The apparatus of claim 59 wherein the patches are arranged such that at least one of the number of conductive rods or distribution of the conductive rods in patches adjacent to each other in orthogonal directions are different and patches adjacent to each other in directions between the orthogonal directions are the same.

* * * * *